United States Patent
Gomi

(10) Patent No.: US 11,425,319 B2
(45) Date of Patent: Aug. 23, 2022

(54) SOLID-STATE IMAGING DEVICE AND IMAGING SYSTEM

(71) Applicant: OLYMPUS CORPORATION, Tokyo (JP)

(72) Inventor: Yuichi Gomi, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 17/086,880

(22) Filed: Nov. 2, 2020

(65) Prior Publication Data

US 2021/0136300 A1     May 6, 2021

Related U.S. Application Data

(63) Continuation of application No. PCT/JP2018/020497, filed on May 29, 2018.

(51) Int. Cl.
  *H04N 5/355*   (2011.01)
  *H04N 5/3745*  (2011.01)
  *H04N 5/369*   (2011.01)

(52) U.S. Cl.
  CPC ..... *H04N 5/35545* (2013.01); *H04N 5/37452* (2013.01); *H04N 5/379* (2018.08)

(58) Field of Classification Search
  CPC ........... H04N 5/35545; H04N 5/37452; H04N 5/379; H04N 5/3532; H04N 5/37457; H01L 27/146
  USPC ..................................................... 348/222.1
  See application file for complete search history.

(56) References Cited

U.S. PATENT DOCUMENTS

| 9,961,262 | B2 * | 5/2018 | Okura ................... H01L 29/945 |
| 2010/0134648 | A1 * | 6/2010 | Funatsu ............. H04N 5/35563 |
| | | | 348/222.1 |
| 2010/0328479 | A1 | 12/2010 | Sambongi |
| 2015/0124139 | A1 * | 5/2015 | Ishiwata ........... H01L 27/14641 |
| | | | 348/308 |

(Continued)

FOREIGN PATENT DOCUMENTS

JP    2010-283573 A    12/2010
JP    2013-55610 A     3/2013

(Continued)

OTHER PUBLICATIONS

International Search Report dated Aug. 7, 2018, issued in counterpart International Application No. PCT/JP2018/020497, with English Translation. (3 pages).

*Primary Examiner* — Lin Ye
*Assistant Examiner* — Chan T Nguyen
(74) *Attorney, Agent, or Firm* — WHDA, LLP

(57) ABSTRACT

In a solid-state imaging device, first electric charge is generated by at least two first photoelectric conversion elements in a first exposure period. At least two pieces of the first electric charge are added in a floating diffusion. A first memory stores a first pixel signal that is based on the first electric charge. Second electric charge is generated by at least one second photoelectric conversion element in a second exposure period. At least part of the second exposure period overlaps at least part of the first exposure period. The second electric charge is held in the floating diffusion. A second memory stores a second pixel signal that is based on the second electric charge.

10 Claims, 16 Drawing Sheets

(56) References Cited

U.S. PATENT DOCUMENTS

2015/0341582 A1\* 11/2015 Sakaguchi ........ H01L 27/14612
  348/301
2016/0141326 A1\* 5/2016 Hanzawa .......... H01L 27/14627
  250/208.1
2016/0316165 A1\* 10/2016 Li ........................ H04N 5/3559

FOREIGN PATENT DOCUMENTS

| JP | 2013-168720 | \* | 8/2013 | ............. H04N 5/335 |
| JP | 2013-168720 A | | 8/2013 | |
| JP | 2015-89036 A | | 5/2015 | |
| JP | 2016-10065 A | | 1/2016 | |
| JP | 2017-55350 A | | 3/2017 | |

\* cited by examiner

SOLID-STATE IMAGING DEVICE AND IMAGING SYSTEM

The present application is a continuation application based on International Patent Application No. PCT/JP2018/020497 filed on May 29, 2018, the content of which is incorporated herein by reference.

BACKGROUND OF THE INVENTION

Field of the Invention

The present invention relates to a solid-state imaging device and an imaging system.

Description of Related Art

In order to realize high-dynamic range (HDR) of an image sensor, a method of combining a high-sensitivity signal and a low-sensitivity signal is generally used. The high-sensitivity signal is a signal that is obtained in a pixel having high sensitivity. The low-sensitivity signal is a signal that is obtained in a pixel having low sensitivity. As a method of obtaining the high-sensitivity signal and the low-sensitivity signal, a method in which the storage time for obtaining each signal is different between signals is widely used. In addition, there is a method in which two types of pixels having different sizes are disposed in a pixel region. There is also a method of obtaining signals from a plurality of pixels having different sensitivity by changing the number of pixel signals that are to be added.

In the method in which the storage time for obtaining each signal is different between signals, the length of the storage period for obtaining each signal is different between signals. For this reason, when a moving object is present, a false signal occurs in a signal generated by combining a plurality of signals due to the deviation of the storage period.

In the method in which two types of pixels having different sizes are disposed in a pixel region, the position of the pixel for obtaining the high-sensitivity signal and the position of the pixel for obtaining the low-sensitivity signal are different from each other. For this reason, in the combined signal, the false signal occurs due to the positional deviation of pixels and the image quality deteriorates. Since this positional deviation is known, it is easy to correct the signal. However, since it is necessary to dispose a plurality of pixels having different sizes, the layout of patterns is complicated. Since characteristics of pixels are highly sensitive to the layout, it is difficult to produce a plurality of pixels having different sizes in one tip. The yield is reduced, compared to a typical image sensor having a uniform pixel size.

A method of obtaining the high-sensitivity signal and the low-sensitivity signal by changing the number of pixel signals that are to be added is disclosed in Japanese Unexamined Patent Application, First Publication No. 2015-89036 and Japanese Unexamined Patent Application, First Publication No. 2017-055350.

SUMMARY OF THE INVENTION

According to a first aspect of the present invention, a solid-state imaging device includes a plurality of photoelectric conversion elements disposed in a matrix shape. The solid-state imaging device includes a plurality of pixel groups. Each photoelectric conversion element included in the plurality of photoelectric conversion elements belongs to any one pixel group included in the plurality of pixel groups. Each pixel group included in the plurality of pixel groups includes at least three photoelectric conversion elements included in the plurality of photoelectric conversion elements. The at least three photoelectric conversion elements include at least two first photoelectric conversion elements configured to generate first electric charge and at least one second photoelectric conversion element configured to generate second electric charge. The at least three photoelectric conversion elements are disposed in at least two rows and at least two columns. Each pixel group included in the plurality of pixel groups includes a floating diffusion, a first memory, and a second memory. The first electric charge is generated by the first photoelectric conversion elements in a first exposure period. The first electric charge is transferred to the floating diffusion at a first timing. At least two pieces of the first electric charge generated by the at least two first photoelectric conversion elements are added in the floating diffusion and held in the floating diffusion. The first memory stores a first pixel signal that is based on the first electric charge held in the floating diffusion. The second electric charge is generated by the second photoelectric conversion element in a second exposure period. At least part of the second exposure period overlaps at least part of the first exposure period. The second electric charge is transferred to the floating diffusion at a second timing different from the first timing and is held in the floating diffusion. The second memory stores a second pixel signal that is based on the second electric charge held in the floating diffusion.

According to a second aspect of the present invention, in the first aspect, the solid-state imaging device may include a first substrate and a second substrate. The first substrate may include the plurality of photoelectric conversion elements. The second substrate may be stacked on the first substrate and may include the first memory and the second memory.

According to a third aspect of the present invention, in the first or second aspect, each pixel group included in the plurality of pixel groups may further include a transfer transistor, a first switch, and a second switch. The transfer transistor may be configured to transfer the first electric charge and the second electric charge to the floating diffusion. The first switch may be connected to the floating diffusion and the first memory. The second switch may be connected to the floating diffusion and the second memory. When the first switch is in an ON state, the first switch may be configured to transfer the first electric charge held in the floating diffusion to the first memory and the second switch may be in an OFF state. When the second switch is in an ON state, the second switch may be configured to transfer the second electric charge held in the floating diffusion to the second memory and the first switch may be in an OFF state.

According to a fourth aspect of the present invention, in the first or second aspect, each pixel group included in the plurality of pixel groups may include at least four photoelectric conversion elements included in the plurality of photoelectric conversion elements. The at least four photoelectric conversion elements may be disposed in at least two consecutive rows and at least two consecutive columns.

According to a fifth aspect of the present invention, in the third aspect, each pixel group included in the plurality of pixel groups may include at least four photoelectric conversion elements included in the plurality of photoelectric conversion elements. The at least four photoelectric conversion elements may be disposed in at least two consecutive rows and at least two consecutive columns.

According to a sixth aspect of the present invention, in the fifth aspect, the at least four photoelectric conversion elements may include the at least two first photoelectric conversion elements and at least two second photoelectric conversion elements configured to generate the second electric charge. The transfer transistor may be configured to sequentially transfer at least two pieces of the second electric charge generated by the at least two second photoelectric conversion elements to the floating diffusion. The second switch may be configured to transfer the second electric charge held in the floating diffusion to the second memory each time the second electric charge is transferred to the floating diffusion. The second memory may be configured to separately store at least two second pixel signals that are based on the at least two pieces of the second electric charge.

According to a seventh aspect of the present invention, in the sixth aspect, the solid-state imaging device may be configured to perform multiple times of imaging. In each of the multiple times of imaging, the first photoelectric conversion element may be configured to generate the first electric charge and the second photoelectric conversion element may be configured to generate the second electric charge. In each of the multiple times of imaging, the transfer transistor may be configured to transfer the first electric charge and the second electric charge to the floating diffusion. In each of the multiple times of imaging, the first switch may be configured to transfer the first electric charge held in the floating diffusion to the first memory and the second switch may be configured to transfer the second electric charge held in the floating diffusion to the second memory. In each of the multiple times of imaging, the first memory may be configured to store the first pixel signal and the second memory may be configured to store the second pixel signal. In each pixel group included in the plurality of pixel groups, a combination of the at least two first photoelectric conversion elements may be different between the multiple times of imaging and a combination of the at least two second photoelectric conversion elements may be different between the multiple times of imaging.

According to an eighth aspect of the present invention, a solid-state imaging device includes a plurality of photoelectric conversion elements disposed in a matrix shape. The solid-state imaging device includes a plurality of pixel groups. Each photoelectric conversion element included in the plurality of photoelectric conversion elements belongs to any one pixel group included in the plurality of pixel groups. Each pixel group included in the plurality of pixel groups includes at least three photoelectric conversion elements included in the plurality of photoelectric conversion elements. The at least three photoelectric conversion elements include at least two first photoelectric conversion elements configured to generate first electric charge and at least one second photoelectric conversion element configured to generate second electric charge. The at least three photoelectric conversion elements are disposed in at least two rows and at least two columns. Each pixel group included in the plurality of pixel groups includes a first floating diffusion, and a second floating diffusion. The first electric charge is generated by the first photoelectric conversion elements in an exposure period. The first electric charge is transferred to the first floating diffusion at a first timing. At least two pieces of the first electric charge generated by the at least two first photoelectric conversion elements are added in the first floating diffusion and held in the first floating diffusion. The second electric charge is generated by the second photoelectric conversion element in the exposure period. The second electric charge is transferred to the second floating diffusion at a second timing the same as the first timing and is held in the second floating diffusion. A first pixel signal that is based on the first electric charge held in the first floating diffusion is output to a first signal line. A second pixel signal that is based on the second electric charge held in the second floating diffusion is output to a second signal line different from the first signal line.

According to a ninth aspect of the present invention, an imaging system includes the solid-state imaging device and a signal processing circuit. The signal processing circuit is configured to combine a first image signal that is based on the first pixel signal and a second image signal that is based on the second pixel signal.

DETAILED DESCRIPTION OF THE INVENTION

Hereinafter, embodiments of the present invention will be described with reference to the drawings.

First Embodiment

Figure 1:
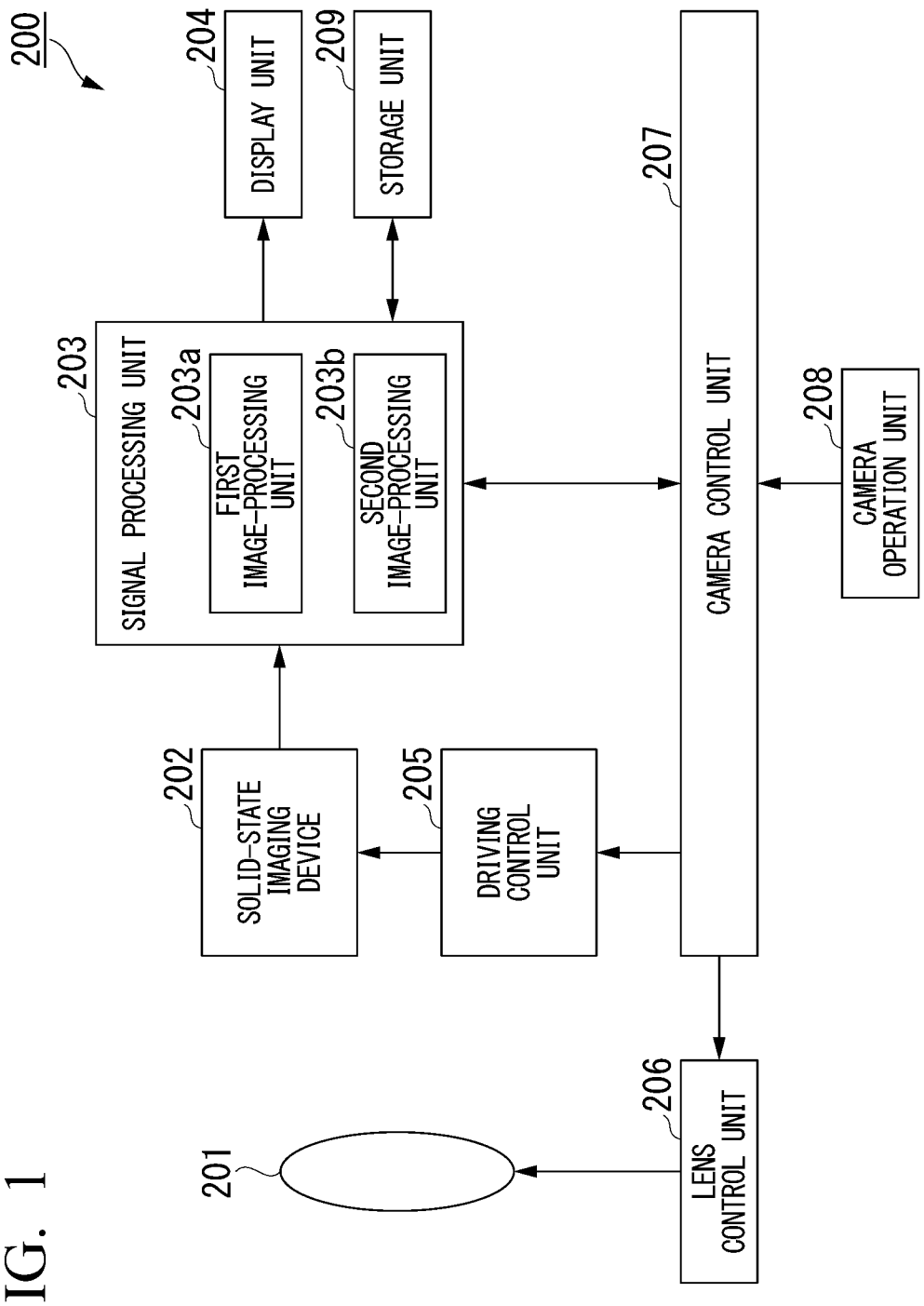
FIG. 1 is a block diagram showing a configuration of an imaging system according to a first embodiment of the present invention.

FIG. 1 shows a configuration of an imaging system 200 according to a first embodiment of the present invention. The imaging system 200 is an electronic device having an imaging function. For example, the imaging system 200 is a digital camera, a digital video camera, an endoscope, and the like. The imaging system 200 shown in FIG. 1 includes a lens 201, a solid-state imaging device 202, a signal processing unit 203 (signal processing circuit), a display unit 204, a driving control unit 205, a lens control unit 206, a camera control unit 207, a camera operation unit 208, and a storage unit 209.

The lens 201 forms an optical image of a subject on an imaging surface of the solid-state imaging device 202. The lens control unit 206 controls a diaphragm of the lens 201, a focal position of the lens 201, and the like. The solid-state imaging device 202 generates a digital image signal on the basis of the optical image of the subject formed by the lens 201. The solid-state imaging device 202 outputs a first image signal and a second image signal. The first image signal is generated on the basis of a high-sensitivity signal and the second image signal is generated on the basis of a low-sensitivity signal. The driving control unit 205 drives the solid-state imaging device 202 and controls an operation of the solid-state imaging device 202.

The signal processing unit 203 performs image processing on the image signal output from the solid-state imaging device 202. The signal processing unit 203 includes a first image-processing unit 203a and a second image-processing unit 203b. The first image-processing unit 203a processes the image signal for record. The second image-processing unit 203b processes the image signal for display. The first image-processing unit 203a and the second image-processing unit 203b combine the first image signal output from the solid-state imaging device 202 and the second image signal output from the solid-state imaging device 202. In this way, the first image-processing unit 203a and the second image-processing unit 203b generate an image having high-dynamic range. The solid-state imaging device 202 may include a signal processing circuit that combines the first image signal and the second image signal.

The display unit 204 displays an image on the basis of the image signal processed by the second image-processing unit 203b. The display unit 204 is able to reproduce and display a still image. The display unit 204 is able to display an image of the subject as a moving image in real time.

The storage unit 209 stores the image signal processed by the first image-processing unit 203a. For example, the storage unit 209 is a memory card. The storage unit 209 may be attachable to and detachable from the imaging system 200. In other words, the storage unit 209 does not need to be an essential configuration to the imaging system 200.

The camera control unit 207 controls the entire imaging system 200. The operation of the camera control unit 207 is prescribed in a program. The program is stored in a ROM built in the imaging system 200. The camera control unit 207 reads the program and performs various types of control in accordance with the contents prescribed by the program.

The camera operation unit 208 includes various members for a user to perform various types of operation input to the imaging system 200. The camera operation unit 208 outputs, to the camera control unit 207, a signal that is based on the result of the operation input.

Figure 2:
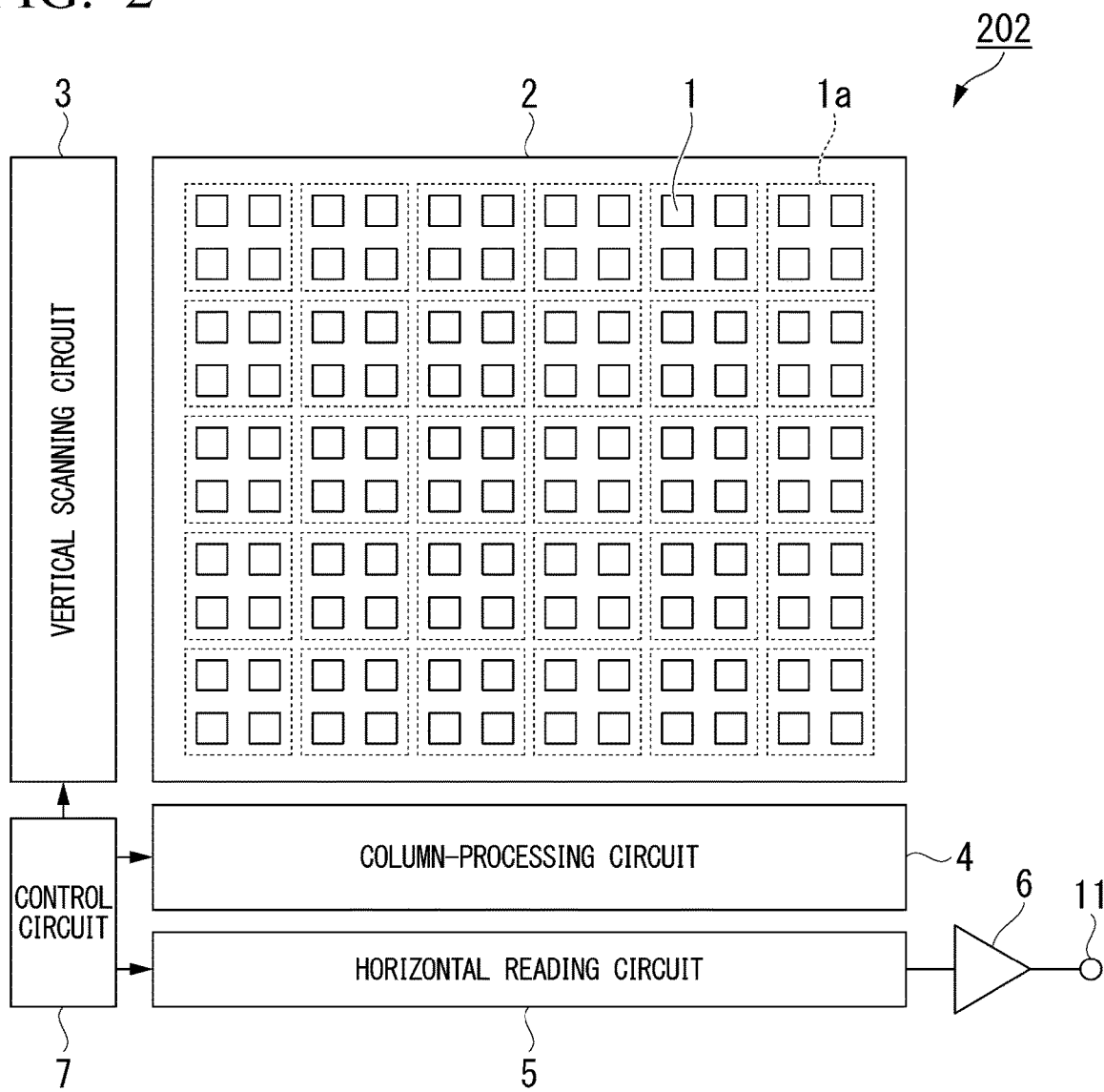
FIG. 2 is a block diagram showing a configuration of a solid-state imaging device according to the first embodiment of the present invention.

FIG. 2 shows a configuration of the solid-state imaging device 202. The solid-state imaging device 202 includes a pixel unit 2, a vertical scanning circuit 3, a column-processing circuit 4, a horizontal reading circuit 5, an output amplifier 6, and a control circuit 7. The pixel unit 2 includes a plurality of pixels 1. The position at which each circuit element shown in FIG. 2 is disposed does not necessarily match the position at which the element is actually disposed.

In the pixel unit 2, the plurality of pixels 1 are disposed in a two-dimensional matrix shape. The number of rows in the array of the plurality of pixels 1 and the number of columns in the array of the plurality of pixels 1 are two or more. A plurality of pixel groups 1a are disposed. Each of the plurality of pixels 1 belongs to any one of the plurality of pixel groups 1a. Each of the plurality of pixel groups 1a includes at least three pixels 1. In the example shown in FIG. 2, each of the plurality of pixel groups 1a includes at least four pixels 1 disposed in at least two consecutive rows and at least two consecutive columns. In each of the plurality of pixel groups 1a, two or more pixels 1 are consecutively disposed in the row direction and the column direction. The four pixels 1 belonging to one pixel group 1a share a floating diffusion (FD).

The array of the pixels 1 shown in FIG. 2 is an example. The number of rows in the array of the pixels 1 may not be the same as the number of rows shown in FIG. 2. The number of columns in the array of the pixels 1 may not be the same as the number of columns shown in FIG. 2. The number of pixels 1 included in one pixel group 1a may not be four. The pixel signal is read from a reading region. The reading region in the first embodiment includes all the pixels 1 included in the solid-state imaging device 202. The reading region may be part of the region including all the pixels 1. The reading region may include an optical black pixel disposed outside the effective pixel region. The optical black pixel is always shielded from light. The pixel signal read from the optical black pixel is used for, for example, correction of dark current components.

The vertical scanning circuit 3 includes, for example, a shift resistor. The vertical scanning circuit 3 performs driving control of the pixels 1 and the pixel groups 1a row by row. This driving control includes the reset operation, the storage operation, the signal reading, and the like. In order to perform this driving control, the vertical scanning circuit 3 outputs a control signal (control pulse) to the pixels 1 and the pixel groups 1a through a control signal line (not shown in the drawing) disposed for each row. As a result of this driving control, the pixel signal is output to a vertical signal line (not shown in the drawing) disposed for each column in the array of the pixel groups 1a.

The column-processing circuit 4 is connected to the vertical signal line. The column-processing circuit 4 performs signal processing on the pixel signal output to the vertical signal line. This signal processing includes noise elimination, amplification, and the like. The horizontal reading circuit 5 includes, for example, a shift resistor. The horizontal reading circuit 5 outputs the pixel signal processed by the column-processing circuit 4 to the output amplifier 6. The output amplifier 6 generates an image signal by amplifying the pixel signal. The image signal is output to the outside of the solid-state imaging device 202 from an output terminal 11.

The control circuit 7 generates a clock signal, a control signal, and the like. The clock signal and the control signal are the standard of the operation of the vertical scanning circuit 3, the column-processing circuit 4, the horizontal reading circuit 5, and the like. The signals generated by the control circuit 7 are output to the vertical scanning circuit 3, the column-processing circuit 4, the horizontal reading circuit 5, and the like. The digitization of the pixel signal may be performed by a circuit in the solid-state imaging device 202 or may be performed by a circuit outside the solid-state imaging device 202.

Figure 3:
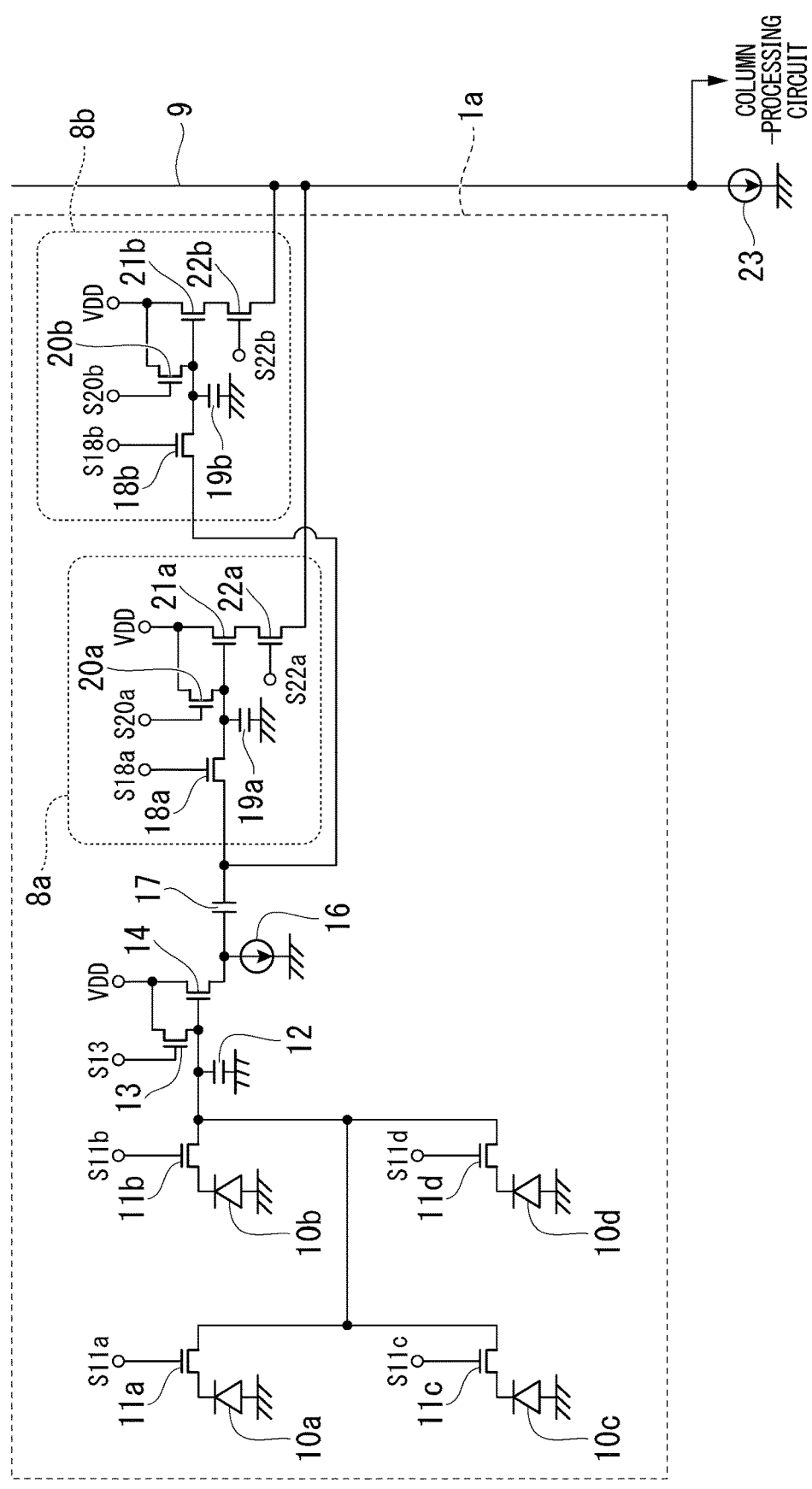
FIG. 3 is a circuit diagram showing a configuration of a pixel group according to the first embodiment of the present invention.

FIG. 3 shows a configuration of the pixel group 1a. One pixel group 1a corresponds to the pixels 1 disposed in two consecutive rows and two consecutive columns. The pixel group 1a shown in FIG. 3 includes four photoelectric conversion elements 10a, 10b, 10c, and 10d, four transfer transistors 11a, 11b, 11c, and 11d, a floating diffusion (FD) 12, a first reset transistor 13, a first amplification transistor 14, a first current source 16, a clamp capacitor 17, and two memory units 8a and 8b.

The memory unit 8a includes a sample transistor 18a, a memory 19a, a second reset transistor 20a, a second amplification transistor 21a, and a selection transistor 22a. The memory unit 8b includes a sample transistor 18b, a memory 19b, a second reset transistor 20b, a second amplification transistor 21b, and a selection transistor 22b.

A schematic configuration of the pixel group 1a will be described. The solid-state imaging device 202 includes a plurality of photoelectric conversion elements 10a, 10b, 10c, and 10d disposed in a matrix shape. The solid-state imaging device 202 includes the plurality of pixel groups 1a. Each of the plurality of photoelectric conversion elements 10a, 10b, 10c, and 10d belongs to any one of the plurality of pixel groups 1a. Each of the plurality of pixel groups 1a includes at least three photoelectric conversion elements included in the plurality of photoelectric conversion elements 10a, 10b, 10c, and 10d. The at least three photoelectric conversion elements includes at least two first photoelectric conversion elements that generate first electric charge and at least one second photoelectric conversion element that generates second electric charge. The at least three photoelectric conversion elements are disposed in at least two rows and at least two columns.

At least two pieces of first electric charge are generated by the at least two first photoelectric conversion elements in a first exposure period. The at least two pieces of first electric charge are transferred to the FD 12 at a first timing. The at least two pieces of first electric charge are added in the FD 12 and held in the FD 12. The memory 19a (first memory) stores a first pixel signal that is based on the first electric charge held in the FD 12. The second electric charge is generated by the at least one second photoelectric conversion element in a second exposure period. At least part of the second exposure period overlaps at least part of the first exposure period. The second electric charge is transferred to the FD 12 at a second timing and is held in the FD 12. The second timing is different from the first timing. The memory 19b (second memory) stores a second pixel signal that is based on the second electric charge held in the FD 12.

A detailed configuration of the pixel group 1a will be described. Each of the plurality of pixel groups 1a includes at least four photoelectric conversion elements included in the plurality of photoelectric conversion elements. The at least four photoelectric conversion elements are disposed in at least two consecutive rows and at least two consecutive columns. The pixel group 1a shown in FIG. 3 includes the four photoelectric conversion elements 10a, 10b, 10c, and 10d disposed in two rows and two columns. The number of photoelectric conversion elements included in one pixel group 1a may be five or more. The number of rows of the array of the photoelectric conversion elements included in one pixel group 1a may be three or more. The number of columns of the array of the photoelectric conversion elements included in one pixel group 1a may be three or more. In the array of the photoelectric conversion elements included in one pixel group 1a, the number of rows and the number of columns may not be the same.

The FD 12, the first reset transistor 13, the first amplification transistor 14, the first current source 16, and the clamp capacitor 17 are shared in the pixel group 1a. The position at which each circuit element shown in FIG. 3 is disposed does not necessarily match the position at which the element is actually disposed.

The photoelectric conversion element 10a and the transfer transistor 11a correspond to a first pixel. The photoelectric conversion element 10b and the transfer transistor 11b correspond to a second pixel. The photoelectric conversion element 10c and the transfer transistor 11c correspond to a third pixel. The photoelectric conversion element 10d and the transfer transistor 11d correspond to a fourth pixel. Hereinafter, the configuration of the first pixel will be described among the four pixels 1 included in one pixel group 1a. The configurations of the second pixel, the third pixel, and the fourth pixel are similar to the configuration of the first pixel. Hereinafter, the configuration of the memory unit 8a will be described. The configuration of the memory unit 8b is similar to the configuration of the memory unit 8a.

A first end of the photoelectric conversion element 10a is connected to a ground. A drain of the transfer transistor 11a is connected to a second end of the photoelectric conversion element 10a. A gate of the transfer transistor 11a is connected to the vertical scanning circuit 3. A transfer pulse S11a is supplied from the vertical scanning circuit 3 to the gate of the transfer transistor 11a.

A first end of the FD 12 is connected to a source of the transfer transistor 11a, a source of the transfer transistor 11b, a source of the transfer transistor 11c, and a source of the transfer transistor 11d. A second end of the FD 12 is connected to the ground. A drain of the first reset transistor 13 is connected to a power source that supplies power source voltage VDD. A source of the first reset transistor 13 is connected to the source of the transfer transistor 11a, the source of the transfer transistor 11b, the source of the transfer transistor 11c, the source of the transfer transistor 11d, and the first end of the FD 12. A gate of the first reset transistor 13 is connected to the vertical scanning circuit 3. A first reset pulse S13 is supplied from the vertical scanning circuit 3 to the gate of the first reset transistor 13.

A drain of the first amplification transistor 14 is connected to the power source that supplies the power supply voltage VDD. A gate of the first amplification transistor 14 is connected to the source of the transfer transistor 11a, the source of the transfer transistor 11b, the source of the transfer transistor 11c, the source of the transfer transistor 11d, and the first end of the FD 12. A first end of the first current source 16 is connected to a source of the first amplification transistor 14. A second end of the first current source 16 is connected to the ground. A first end of the clamp capacitor 17 is connected to the source of the first amplification transistor 14 and the first end of the first current source 16.

A drain of the sample transistor 18a is connected to a second end of the clamp capacitor 17. A gate of the sample transistor 18a is connected to the vertical scanning circuit 3. A sample pulse S18a is supplied from the vertical scanning circuit 3 to the gate of the sample transistor 18a. A drain of the second reset transistor 20a is connected to the power source that supplies the power supply voltage VDD. A source of the second reset transistor 20a is connected to a source of the sample transistor 18a. A gate of the second reset transistor 20a is connected to the vertical scanning circuit 3. A second reset pulse S20a is supplied from the vertical scanning circuit 3 to the gate of the second reset transistor 20a.

A first end of the memory 19a is connected to the source of the sample transistor 18a. A second end of the memory 19a is connected to the ground. A drain of the second amplification transistor 21a is connected to the power source that supplies the power supply voltage VDD. A gate of the second amplification transistor 21a is connected to the source of the sample transistor 18a and the first end of the memory 19a. A drain of the selection transistor 22a is connected to a source of the second amplification transistor 21a. A source of the selection transistor 22a is connected to a vertical signal line 9. A gate of the selection transistor 22a is connected to the vertical scanning circuit 3. A selection pulse S22a is supplied from the vertical scanning circuit 3 to the gate of the selection transistor 22a.

The photoelectric conversion element 10a is a photodiode. The photoelectric conversion element 10a images a subject and outputs a pixel signal. Specifically, the photoelectric conversion element 10a generates electric charge that is based on the amount of light incident to the photoelectric conversion element 10a and holds and accumulates the generated electric charge. The photoelectric conversion element 10a outputs the electric charge as the pixel signal.

The transfer transistor 11a is connected to the photoelectric conversion element 10a and the FD 12. The transfer transistor 11a switches between a first state and a second state. In the first state, the photoelectric conversion element 10a and the FD 12 are electrically connected to each other. In the second state, the photoelectric conversion element 10a and the FD 12 are electrically insulated from each other. When the transfer transistor 11a is in an ON state, the photoelectric conversion element 10a and the FD 12 are electrically connected to each other. When the transfer transistor 11a is in an OFF state, the photoelectric conversion element 10a and the FD 12 are electrically insulated from each other. When the photoelectric conversion element 10a and the FD 12 are electrically connected to each other, the transfer transistor 11a transfers the electric charge accumulated in the photoelectric conversion element 10a to the FD 12. Turning on and off the transfer transistor 11a is controlled on the basis of the transfer pulse S11a supplied from the vertical scanning circuit 3.

A transfer pulse S11b is supplied from the vertical scanning circuit 3 to a gate of the transfer transistor 11b. A transfer pulse S11c is supplied from the vertical scanning circuit 3 to a gate of the transfer transistor 11c. A transfer pulse S11d is supplied from the vertical scanning circuit 3 to a gate of the transfer transistor 11d.

The FD 12 temporarily holds and accumulates the electric charge transferred from the photoelectric conversion elements 10a, 10b, 10c, and 10d and converts the electric charge into voltage.

The first reset transistor 13 is connected to the power source and the FD 12. The first reset transistor 13 switches between a first state and a second state. In the first state, the power source and the FD 12 are electrically connected to each other. In the second state, the power source and the FD 12 are electrically insulated from each other. When the first reset transistor 13 is in the ON state, the power source and the FD 12 are electrically connected to each other. When the first reset transistor 13 is in the OFF state, the power source and the FD 12 are electrically insulated from each other. When the power source and the FD 12 are electrically connected to each other, the first reset transistor 13 resets the FD 12. Turning on and off the first reset transistor 13 is controlled on the basis of the first reset pulse S13 supplied from the vertical scanning circuit 3. When the transfer transistor 11a and the first reset transistor 13 are in the ON state, the photoelectric conversion element 10a is reset. By resetting the photoelectric conversion element 10a and the FD 12, the amount of electric charge accumulated in the photoelectric conversion element 10a and the FD 12 is controlled. Through this reset, the state (potential) of the photoelectric conversion element 10a and the FD 12 is set to a reference state (reference potential or reset level).

The first amplification transistor 14 amplifies the voltage that is based on the electric charge held in the FD 12 and outputs the amplified voltage as the pixel signal from the source. The first current source 16 functions as a load of the first amplification transistor 14 and supplies current for driving the first amplification transistor 14 to the first amplification transistor 14. The first amplification transistor 14 and the first current source 16 constitute a source follower circuit.

The clamp capacitor 17 clamps (fixes) a voltage level of the pixel signal output from the first amplification transistor 14. The sample transistor 18a is connected to the clamp capacitor 17 and the memory 19a. The sample transistor 18a switches between a first state and a second state. In the first state, the clamp capacitor 17 and the memory 19a are electrically connected to each other. In the second state, the clamp capacitor 17 and the memory 19a are electrically insulated from each other. When the sample transistor 18a is in the ON state, the clamp capacitor 17 and the memory 19a are electrically connected to each other. When the sample transistor 18a is in the OFF state, the clamp capacitor 17 and the memory 19a are electrically insulated from each other. When the clamp capacitor 17 and the memory 19a are electrically connected to each other, the sample transistor 18a samples the voltage of the second end of the clamp capacitor 17. In this way, the sample transistor 18a transfers the pixel signal output from the first amplification transistor 14 to the memory 19a. Turning on and off the sample transistor 18a is controlled on the basis of the sample pulse S18a supplied from the vertical scanning circuit 3.

The memory 19a holds the pixel signal sampled by the sample transistor 18a. For example, a metal-insulator-metal (MIM) capacitor or a metal-oxide-semiconductor MOS) capacitor is used as the memory 19a. The MIM capacitor and the MOS capacitor are capacitors causing little leakage. In this way, the resistance to noise is improved and a high-quality signal is obtained.

The second reset transistor 20a is connected to the power source and the memory 19a. The second reset transistor 20a switches between a first state and a second state. In the first state, the power source and the memory 19a are electrically connected to each other. In the second state, the power source and the memory 19a are electrically insulated from each other. When the second reset transistor 20a is in the ON state, the power source and the memory 19a are electrically connected to each other. When the second reset transistor 20a is in the OFF state, the power source and the memory 19a are electrically insulated from each other. When the power source and the memory 19a are electrically connected to each other, the second reset transistor 20a resets the memory 19a. Turning on and off the second reset transistor 20a is controlled on the basis of the second reset pulse S20a supplied from the vertical scanning circuit 3. When the sample transistor 18a and the second reset transistor 20a are in the ON state, the clamp capacitor 17 is reset. By resetting the clamp capacitor 17 and the memory 19a, the amount of electric charge accumulated in the clamp capacitor 17 and the memory 19a is controlled. Through this reset, a state (potential) of the clamp capacitor 17 and the memory 19a is set to a reference state (a reference potential or a reset level).

The second amplification transistor 21a amplifies the voltage that is based on the pixel signal held in the memory 19a and outputs the amplified voltage as a pixel signal from the source. A second current source 23 connected to the vertical signal line 9 functions as a load of the second amplification transistor 21a and supplies current for driving the second amplification transistor 21a to the second amplification transistor 21a. The second amplification transistor 21a and the second current source 23 constitute a source follower circuit.

The selection transistor 22a is connected to the second amplification transistor 21a and the vertical signal line 9. The selection transistor 22a switches between a first state and a second state. In the first state, the second amplification transistor 21a and the vertical signal line 9 are electrically connected to each other. In the second state, the second amplification transistor 21a and the vertical signal line 9 are electrically insulated from each other. When the selection transistor 22a is in the ON state, the second amplification transistor 21a and the vertical signal line 9 are electrically connected to each other. When the selection transistor 22a is in the OFF state, the second amplification transistor 21a and the vertical signal line 9 are electrically insulated from each other. When the second amplification transistor 21a and the vertical signal line 9 are electrically connected to each other, the selection transistor 22a outputs the pixel signal output from the second amplification transistor 21a to the vertical signal line 9. Turning on and off the selection transistor 22a is controlled on the basis of the selection pulse S22a supplied from the vertical scanning circuit 3.

A sample pulse S18b is supplied from the vertical scanning circuit 3 to a gate of the sample transistor 18b. A second reset pulse S20b is supplied from the vertical scanning circuit 3 to a gate of the second reset transistor 20b. A selection pulse S22b is supplied from the vertical scanning circuit 3 to a gate of the selection transistor 22b.

The transfer transistors 11a, 11b, 11c, and 11d transfer the first electric charge and the second electric charge to the FD 12. The sample transistor 18a (first switch) is connected to the FD 12 and the memory 19a (first memory). The sample transistor 18b (second switch) is connected to the FD 12 and the memory 19b (second memory). When the sample transistor 18a is in the ON state, the sample transistor 18a transfers the first electric charge held in the FD 12 from the FD 12 to the memory 19a and the sample transistor 18b is in the OFF state. When the sample transistor 18b is in the ON state, the sample transistor 18b transfers the second electric charge held in the FD 12 from the FD 12 to the memory 19b and the sample transistor 18a is in the OFF state.

The transistors included in the pixel group 1a shown in FIG. 3 are NMOS transistors. The transistors included in the pixel group 1a may be PMOS transistors. In this case, the polarity of the power source and the polarity of the ground are opposite to the respective polarities shown in FIG. 3.

Figure 4:
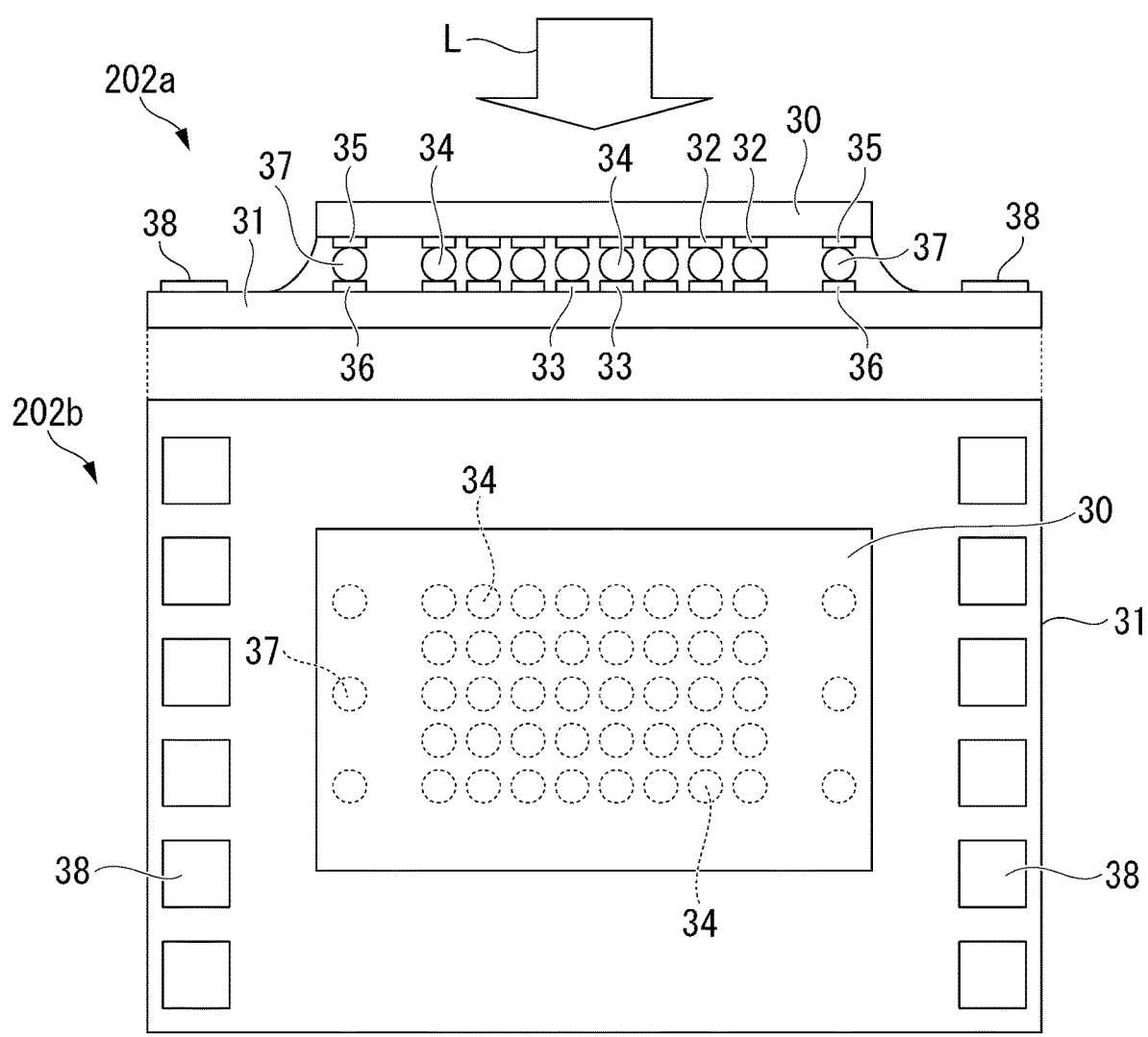
FIG. 4 is a cross-sectional view and a plan view of the solid-state imaging device according to the first embodiment of the present invention.

FIG. 4 shows a sectional structure 202a of the solid-state imaging device 202 and a planar structure 202b of the solid-state imaging device 202. The solid-state imaging device 202 includes two substrates that are stacked on top of each other. The two substrates are a first substrate 30 and a second substrate 31. The photoelectric conversion elements 10a, 10b, 10c, and 10d are disposed in the first substrate 30. The memories 19a and 19b are disposed in the second substrate 31.

The first substrate 30 includes the plurality of photoelectric conversion elements 10a, 10b, 10c, and 10d. The second substrate 31 is stacked on the first substrate 30 and includes the memories 19a and 19b. According to this configuration, the area of the photoelectric conversion elements 10a, 10b, 10c, and 10d can be made large. According to this configuration, the influence of optical noise on the pixel signals held in the memories 19a and 19b can be suppressed. The other circuit elements included in the pixel group 1a are disposed in any one of the first substrate 30 and the second substrate 31. The first substrate 30 and the second substrate 31 are electrically connected to each other and electric signals are transferred between the first substrate 30 and the second substrate 31.

The first substrate 30 includes a first surface and a second surface as two main surfaces. The surface area of the main surface is relatively larger than the surface area of the side surface. The photoelectric conversion elements 10a, 10b, 10c, and 10d are disposed on the first surface side irradiated with light L. The light L emitted on the first substrate 30 is incident to the photoelectric conversion elements 10a, 10b, 10c, and 10d. A large number of micro-pads 32 are disposed for each pixel group 1a on the second surface of the first substrate 30. The micro-pads 32 are electrodes for connecting the first substrate 30 and the second substrate 31 together.

The second substrate 31 includes a third surface and a fourth surface as two main surfaces. The third surface of the second substrate 31 faces the second surface of the first substrate 30. The second substrate 31 is stacked on the second surface of the first substrate 30. On the third surface of the second substrate 31, a large number of micro-pads 33 are disposed at positions corresponding to the micro-pads 32. The micro-pads 33 are electrodes for connecting the first substrate 30 and the second substrate 31 together. Micro-bumps 34 are disposed between the micro-pads 32 and the micro-pads 33. The first substrate 30 and the second substrate 31 are stacked in a state in which the micro-pads 32 and the micro-pads 33 face each other. The first substrate 30 and the second substrate 31 are integrated in a state in which the micro-pads 32 and the micro-pads 33 are electrically connected together by the micro-bumps 34. The micro-pads 32, the micro-bumps 34, and the micro-pads 33 are connection electrodes that connect the first substrate 30 and the second substrate 31 together.

The photoelectric conversion elements 10a, 10b, 10c, and 10d, the transfer transistors 11a, 11b, 11c, and 11d, the FD 12, the first reset transistor 13, and the first amplification transistor 14 are disposed in the first substrate 30. The first current source 16, the clamp capacitor 17, the sample transistors 18a and 18b, the second reset transistors 20a and 20b, the memories 19a and 19b, the second amplification transistors 21a and 21b, and the selection transistors 22a and 22b are disposed in the second substrate 31. In this case, the connection electrode is disposed between the source of the first amplification transistor 14 of the first substrate 30 and the first end of the clamp capacitor 17 of the second substrate 31. The pixel signal output from the first amplification transistor 14 of the first substrate 30 is input to the second substrate 31 via the connection electrode. The combination of circuit elements disposed in the first substrate 30 and the second substrate 31 is not limited to the above-described combination. The connection electrodes may be disposed at any position on the electrically connected paths from the photoelectric conversion elements 10a, 10b, 10c, and 10d to the memories 19a and 19b.

Micro-pads 35 having a similar structure to the micro-pads 32 are disposed on the periphery of the second surface of the first substrate 30. On the third surface of the second substrate 31, micro-pads 36 having a similar structure to the micro-pads 33 are disposed at positions corresponding to the micro-pads 35. Micro-bumps 37 are disposed between the micro-pads 35 and the micro-pads 36. The power source voltage and the like for driving the circuit elements disposed in the first substrate 30 or the circuit elements disposed in the second substrate 31 are supplied from the first substrate 30 to the second substrate 31 or from the second substrate 31 to the first substrate 30 via the micro-pads 35, micro-bumps 37, and the micro-pads 36.

Pads 38 used as an interface with a system other than the first substrate 30 and the second substrate 31 are disposed on the periphery of the third surface of the second substrate 31. Instead of the pads 38, through-electrodes penetrating the second substrate 31 may be disposed and the through-electrodes may be used as electrodes for external connection. In the example shown in FIG. 4, the area of the main surface of the first substrate 30 and the area of the main surface of the second substrate 31 are different from each other. The area of the main surface of the first substrate 30 may be the same as the area of the main surface of the second substrate 31. Micro-bumps may not be disposed. In such a case, micro-pads (first electrodes) disposed on the surface of the first substrate 30 and micro-pads (second electrodes) disposed on the surface of the second substrate 31 may be directly bonded together.

The solid-state imaging device 202 includes the two stacked substrates. In a case in which there is a relatively large margin in the pixel size and it is possible to take measures against stray light or the like, all the circuit elements may be disposed in one substrate. The stray light results in optical noise.

Figure 5:
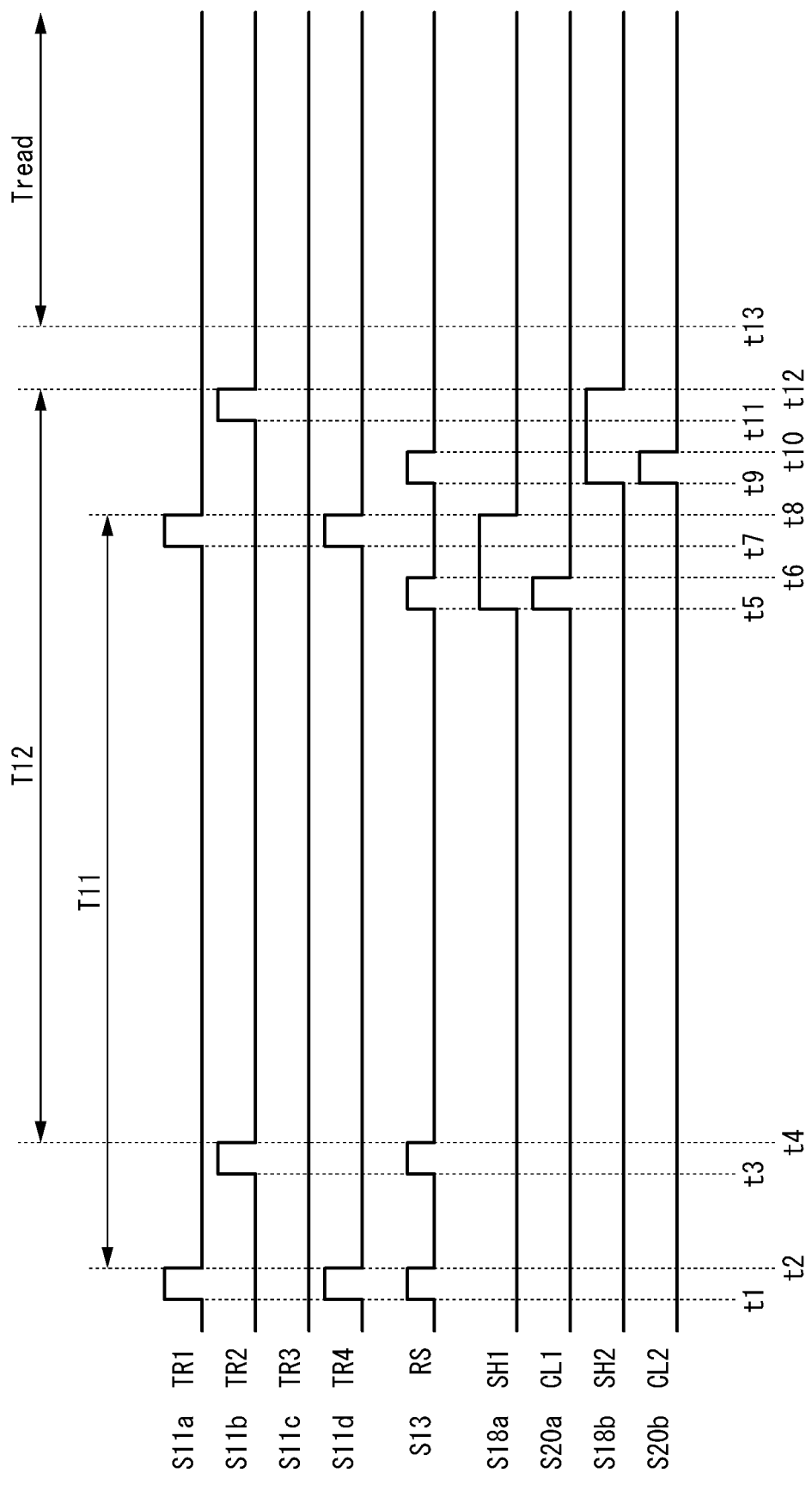
FIG. 5 is a timing chart showing an operation of the solid-state imaging device according to the first embodiment of the present invention.

FIG. 5 shows an operation of the solid-state imaging device 202. In FIG. 5, a waveform of each pulse is shown. The horizontal direction in FIG. 5 represents time and the vertical direction in FIG. 5 represents voltage. In the operation shown in FIG. 5, the photoelectric conversion elements 10a and 10d generate a high-sensitivity signal (first pixel signal) and the signal is held in the memory 19a. In the operation shown in FIG. 5, the photoelectric conversion element 10b generates a low-sensitivity signal (second pixel signal) and the signal is held in the memory 19b.

Before a time point t1, the level of each pulse is an L (Low) level. At the time point t1, the transfer pulse S11a, the transfer pulse S11d, and the first reset pulse S13 change from the L level to an H (High) level. For this reason, the transfer transistor 11a, the transfer transistor 11d, and the first reset transistor 13 are turned on. At the time point t1, the photoelectric conversion element 10a and the photoelectric conversion element 10d are reset. At a time point t2 after the time point t1, the transfer pulse S11a, the transfer pulse S11d, and the first reset pulse S13 change from the H level to the L level. For this reason, the transfer transistor 11a, the transfer transistor 11d, and the first reset transistor 13 are turned off. At the time point t2, the photoelectric conversion element 10a and the photoelectric conversion element 10d start imaging. In other words, the photoelectric conversion element 10a and the photoelectric conversion element 10d start accumulation of electric charge, that is, generation of the pixel signal (high-sensitivity signal).

At a time point t3 after the time point t2, the transfer pulse S11b and the first reset pulse S13 change from the L level to the H level. For this reason, the transfer transistor 11b and the first reset transistor 13 are turned on. At the time point t3, the photoelectric conversion element 10b is reset. At a time point t4 after the time point t3, the transfer pulse S11b and the first reset pulse S13 change from the H level to the L level. For this reason, the transfer transistor 11b and the first reset transistor 13 are turned off. At the time point t4, the photoelectric conversion element 10b starts imaging. In other words, the photoelectric conversion element 10b starts accumulation of electric charge, that is, generation of the pixel signal (low-sensitivity signal).

At a time point t5 after the time point t4, the first reset pulse S13 changes from the L level to the H level. For this reason, the first reset transistor 13 is turned on. At the time point t5, the FD 12 is reset. At a time point t6 after the time point t5, the first reset pulse S13 changes from the H level to the L level. For this reason, the first reset transistor 13 is turned off.

At the time point t5, the sample pulse S18a and the second reset pulse S20a change from the L level to the H level. For this reason, the sample transistor 18a and the second reset transistor 20a are turned on. At the time point t5, the clamp capacitor 17 and the memory 19a are reset. At the time point t6, the second reset pulse S20a changes from the H level to the L level. For this reason, the second reset transistor 20a is turned off.

At a time point t7 after the time point t6, the transfer pulse S11a and the transfer pulse S11d change from the L level to the H level. For this reason, the transfer transistor 11a and the transfer transistor 11d are turned on. At the time point t7, the electric charge output from each of the photoelectric conversion element 10a and the photoelectric conversion element 10d is transferred to the FD 12.

At a time point t8 after the time point t7, the transfer pulse S11a and the transfer pulse S11d change from the H level to the L level. For this reason, the transfer transistor 11a and the transfer transistor 11d are turned off. At the time point t8, the photoelectric conversion element 10a and the photoelectric conversion element 10d complete imaging. In other words, the photoelectric conversion element 10a and the photoelectric conversion element 10d complete accumulation of electric charge, that is, generation of the pixel signal.

In an exposure period T11, electric charge that is based on light incident to each of the photoelectric conversion element 10a and the photoelectric conversion element 10d is accumulated in each of the photoelectric conversion element 10a and the photoelectric conversion element 10d. The exposure period T11 is a period from the time point t2 to the time point t8. The electric charge output from the photoelectric conversion element 10a and the electric charge output from the photoelectric conversion element 10d are added in the FD 12 and held in the FD 12.

At the time point t7, the first amplification transistor 14 amplifies the voltage that is based on the electric charge held in the FD 12 and outputs the amplified voltage as the pixel signal. The pixel signal output from the first amplification transistor 14 is held in the clamp capacitor 17. Since the sample transistor 18a is in the ON state, the sample transistor 18a samples the voltage of the second end of the clamp capacitor 17. At the time point t8, the memory 19a holds the pixel signal (high-sensitivity signal).

At a time point t9 after the time point t8, the first reset pulse S13 changes from the L level to the H level. For this reason, the first reset transistor 13 is turned on. At the time point t9, the FD 12 is reset. At a time point t10 after the time point t9, the first reset pulse S13 changes from the H level to the L level. For this reason, the first reset transistor 13 is turned off.

At the time point t9, the sample pulse S18b and the second reset pulse S20b change from the L level to the H level. For this reason, the sample transistor 18b and the second reset transistor 20b are turned on. At the time point t9, the clamp capacitor 17 and the memory 19b are reset. At the time point t10, the second reset pulse S20b changes from the H level to the L level. For this reason, the second reset transistor 20b is turned off.

At a time point t11 after the time point t10, the transfer pulse S11b changes from the L level to the H level. For this reason, the transfer transistor 11b is turned on. At the time point t11, the electric charge output from the photoelectric conversion element 10b is transferred to the FD 12.

At a time point t12 after the time point t11, the transfer pulse S11b changes from the H level to the L level. For this reason, the transfer transistor 11b is turned off. At the time point t12, the photoelectric conversion element 10b completes imaging. In other words, the photoelectric conversion element 10b completes accumulation of electric charge, that is, generation of the pixel signal.

In an exposure period T12, electric charge that is based on light incident to the photoelectric conversion element 10b is accumulated in the photoelectric conversion element 10b. The exposure period T12 is a period from the time point t4 to the time point t12. The electric charge output from the photoelectric conversion element 10b is held in the FD 12.

At the time point t11, the first amplification transistor 14 amplifies the voltage that is based on the electric charge held in the FD 12 and outputs the amplified voltage as the pixel signal. The pixel signal output from the first amplification transistor 14 is held in the clamp capacitor 17. Since the sample transistor 18b is in the ON state, the sample transistor 18b samples the voltage of the second end of the clamp capacitor 17. At the time point t12, the memory 19b holds the pixel signal (low-sensitivity signal).

The operation shown in FIG. 5 is simultaneously performed in all the pixel groups 1a disposed in the solid-state imaging device 202. For this reason, the global-electronic-shutter operation is realized.

In a reading period Tread, the pixel signals held in the memory 19a and the memory 19b are read. The reading period Tread is started at a time point t13 after the time point t12. The second amplification transistor 21a amplifies the voltage that is based on the pixel signal held in the memory 19a and outputs the amplified voltage as the first pixel signal. The selection transistor 22a outputs the first pixel signal output from the second amplification transistor 21a to the vertical signal line 9. The second amplification transistor 21b amplifies the voltage that is based on the pixel signal held in the memory 19b and outputs the amplified voltage as the second pixel signal. The selection transistor 22b outputs the second pixel signal output from the second amplification transistor 21b to the vertical signal line 9. The timing at which the first pixel signal is output to the vertical signal line 9 and the timing at which the second pixel signal is output to the vertical signal line 9 are different from each other.

In the operation shown in FIG. 5, at least two pieces of first electric charge are generated by at least two first photoelectric conversion elements in the exposure period T11 (first exposure period). The first photoelectric conversion elements are the photoelectric conversion element 10a and the photoelectric conversion element 10d. The at least two pieces of first electric charge are transferred to the FD 12 at the time point t7. The at least two pieces of first electric charge transferred to the FD 12 are added in the FD 12 and are held in the FD 12. The memory 19a stores the first pixel signal that is based on the first electric charge held in the FD 12. Second electric charge is generated by at least one second photoelectric conversion element in the exposure period T12 (second exposure period). The second photoelectric conversion element is the photoelectric conversion element 10b. At least part of the exposure period T12 overlaps at least part of the exposure period T11. The second electric charge is transferred to the FD 12 at the time point t11 and is held in the FD 12. The memory 19b stores the second pixel signal that is based on the second electric charge held in the FD 12.

In the operation shown in FIG. 5, the photoelectric conversion elements 10a and 10d are used for acquiring the high-sensitivity signal and the photoelectric conversion element 10b is used for acquiring the low-sensitivity signal. The row positions of the two photoelectric conversion elements 10a and 10d are different from each other and the column positions of the two photoelectric conversion elements 10a and 10d are different from each other. As long as the FD 12 is shared by each photoelectric conversion element, it is possible to acquire each of the high-sensitivity signal and the low-sensitivity signal by using a combination of arbitrary photoelectric conversion element. For this reason, the direction in which a plurality of pixels related to addition of electric charge are disposed is not limited to the horizontal direction or the vertical direction.

The high-sensitivity signal is obtained by adding the electric charge of the photoelectric conversion element 10a and the electric charge of the photoelectric conversion element 10d. The low-sensitivity signal is obtained on the basis of the electric charge of only the photoelectric conversion element 10b. In addition, the length of the exposure period T11 for generating the high-sensitivity signal is the same as the length of the exposure period T12 for generating the low-sensitivity signal. At least part of the exposure period T12 overlaps at least part of the exposure period T11. The deviation between the exposure period T11 and the exposure period T12 is a period required for storing a signal output from a photoelectric conversion element in a memory. The length of the period is several μ sec. A typical exposure time is, for example, one frame time and the length of it is 33.3 msec. The above-described deviation is much shorter than the typical exposure time.

Therefore, by combining the first image signal and the second image signal, it is possible to obtain a high-dynamic-range image in which deterioration of the image quality is suppressed. The first image signal is generated on the basis of the high-sensitivity signal. The second image signal is generated on the basis of the low-sensitivity signal. The solid-state imaging device 202 and the imaging system 200 can suppress deterioration of the image quality.

Modified Example of First Embodiment

Figure 6:
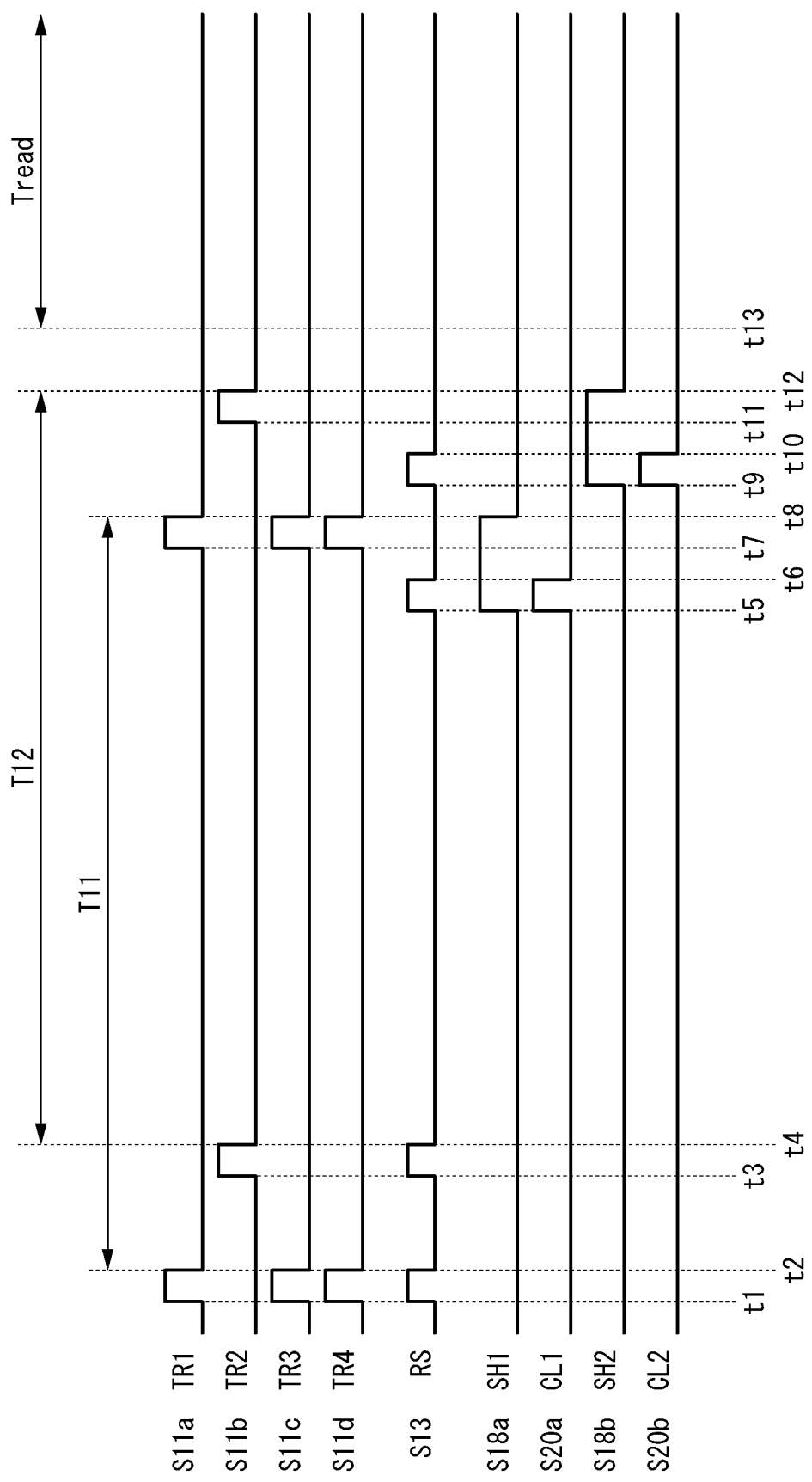
FIG. 6 is a timing chart showing an operation of a solid-state imaging device according to a modified example of the first embodiment of the present invention.

FIG. 6 shows an operation of the solid-state imaging device 202 according to a modified example of the first embodiment. In FIG. 6, the same part as that shown in FIG. 5 will not be described. In the operation shown in FIG. 6, the photoelectric conversion elements 10a, 10c, and 10d generate the high-sensitivity signal and the signal is held in the memory 19a. In the operation shown in FIG. 6, the photoelectric conversion element 10b generates the low-sensitivity signal and the signal is held in the memory 19b.

At a time point t1, the transfer pulse S11a, the transfer pulse S11c, the transfer pulse S11d, and the first reset pulse S13 change from the L level to the H level. For this reason, the transfer transistor 11a, the transfer transistor 11c, the transfer transistor 11d, and the first reset transistor 13 are turned on. At the time point t1, the photoelectric conversion element 10a, the photoelectric conversion element 10c, and the photoelectric conversion element 10d are reset. At a time point t2 after the time point t1, the transfer pulse S11a, the transfer pulse S11c, the transfer pulse S11d, and the first reset pulse S13 change from the H level to the L level. For this reason, the transfer transistor 11a, the transfer transistor 11c, the transfer transistor 11d, and the first reset transistor 13 are turned off.

The operation of the solid-state imaging device 202 from a time point t3 to a time point t6 is the same as the operation of the solid-state imaging device 202 from the time point t3 to the time point t6 shown in FIG. 5. At a time point t7, the transfer pulse S11a, the transfer pulse S11c, and the transfer pulse S11d change from the L level to the H level. For this reason, the transfer transistor 11a, the transfer transistor 11c, and the transfer transistor 11d are turned on. At the time point t7, the electric charge output from each of the photoelectric conversion element 10a, the photoelectric conversion element 10c, and the photoelectric conversion element 10d is transferred to the FD 12.

At a time point t8, the transfer pulse S11a, the transfer pulse S11c, and the transfer pulse S11d change from the H level to the L level. For this reason, the transfer transistor 11a, the transfer transistor 11c, and the transfer transistor 11d are turned off. The electric charge output from the photoelectric conversion element 10a, the electric charge output from the photoelectric conversion element 10c, and the electric charge output from the photoelectric conversion element 10d are added in the FD 12 and held in the FD 12. The operation of the solid-state imaging device 202 from a time point t9 to a time point t12 is the same as the operation of the solid-state imaging device 202 from the time point t9 to the time point t12 shown in FIG. 5.

In the operation shown in FIG. 5, the two pieces of electric charge output from the two photoelectric conversion elements are added. In the operation shown in FIG. 6, the three pieces of electric charge output from the three photoelectric conversion elements are added. For this reason, in the operation shown in FIG. 6, the signal ratio between the high-sensitivity signal and the low-sensitivity signal is larger than the signal ratio in the operation shown in FIG. 5. In addition, in a case in which a moving object is not included in a subject, the deviation of exposure periods does not influence the image quality. In such a case, the difference between the exposure time for the high-sensitivity signal and the exposure time for the low-sensitivity signal may be set to be large. In this way, it is possible to make the signal ratio between the high-sensitivity signal and the low-sensitivity signal large.

Second Embodiment

Figure 7:
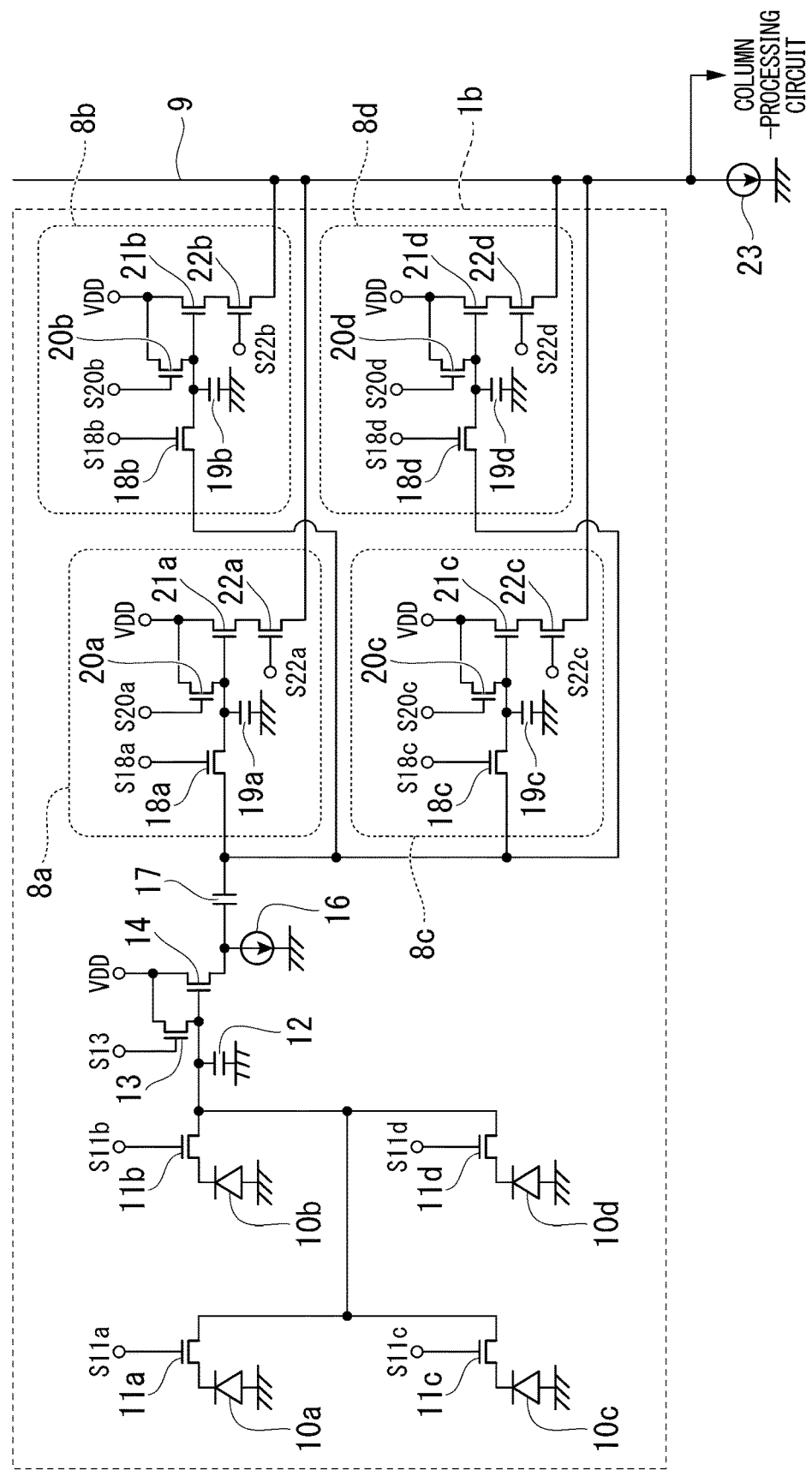
FIG. 7 is a circuit diagram showing a configuration of a pixel group according to a second embodiment of the present invention.

A second embodiment of the present invention will be described by using the solid-state imaging device 202 shown in FIG. 2. In the second embodiment, the pixel group 1a shown in FIG. 3 is changed to a pixel group 1b shown in FIG. 7. FIG. 7 shows a configuration of the pixel group 1b. The same configuration as that shown in FIG. 3 will not be described.

The pixel group 1b includes a memory unit 8c and a memory unit 8d in addition to the configuration of the pixel group 1a shown in FIG. 3. The memory unit 8c includes a sample transistor 18c, a memory 19c, a second reset transistor 20c, a second amplification transistor 21c, and a selection transistor 22c. The memory unit 8d includes a sample transistor 18d, a memory 19d, a second reset transistor 20d, a second amplification transistor 21d, and a selection transistor 22d. The configuration of each of the memory unit 8c and the memory unit 8d is similar to the configuration of the memory unit 8a. In the second embodiment, the number of memory units is the same as the number of photoelectric conversion elements. The position at which each circuit element shown in FIG. 7 is disposed does not necessarily match the position at which the element is actually disposed.

A sample pulse S18c is supplied from the vertical scanning circuit 3 to a gate of the sample transistor 18c. A second reset pulse S20c is supplied from the vertical scanning circuit 3 to a gate of the second reset transistor 20c. A selection pulse S22c is supplied from the vertical scanning circuit 3 to a gate of the selection transistor 22c.

A sample pulse S18d is supplied from the vertical scanning circuit 3 to a gate of the sample transistor 18d. A second reset pulse S20d is supplied from the vertical scanning circuit 3 to a gate of the second reset transistor 20d. A selection pulse S22d is supplied from the vertical scanning circuit 3 to a gate of the selection transistor 22d.

In the second embodiment, the method of driving the solid-state imaging device 202 for obtaining the high-sensitivity signal and the low-sensitivity signal is similar to the method of driving the solid-state imaging device 202 according to the first embodiment. In the second embodiment, since four memory units are disposed, the memory unit 8a does not need to hold the high-sensitivity signal and the memory unit 8b does not need to hold the low-sensitivity signal. The high-sensitivity signal and the low-sensitivity signal may be held in any memory units.

Figure 8:
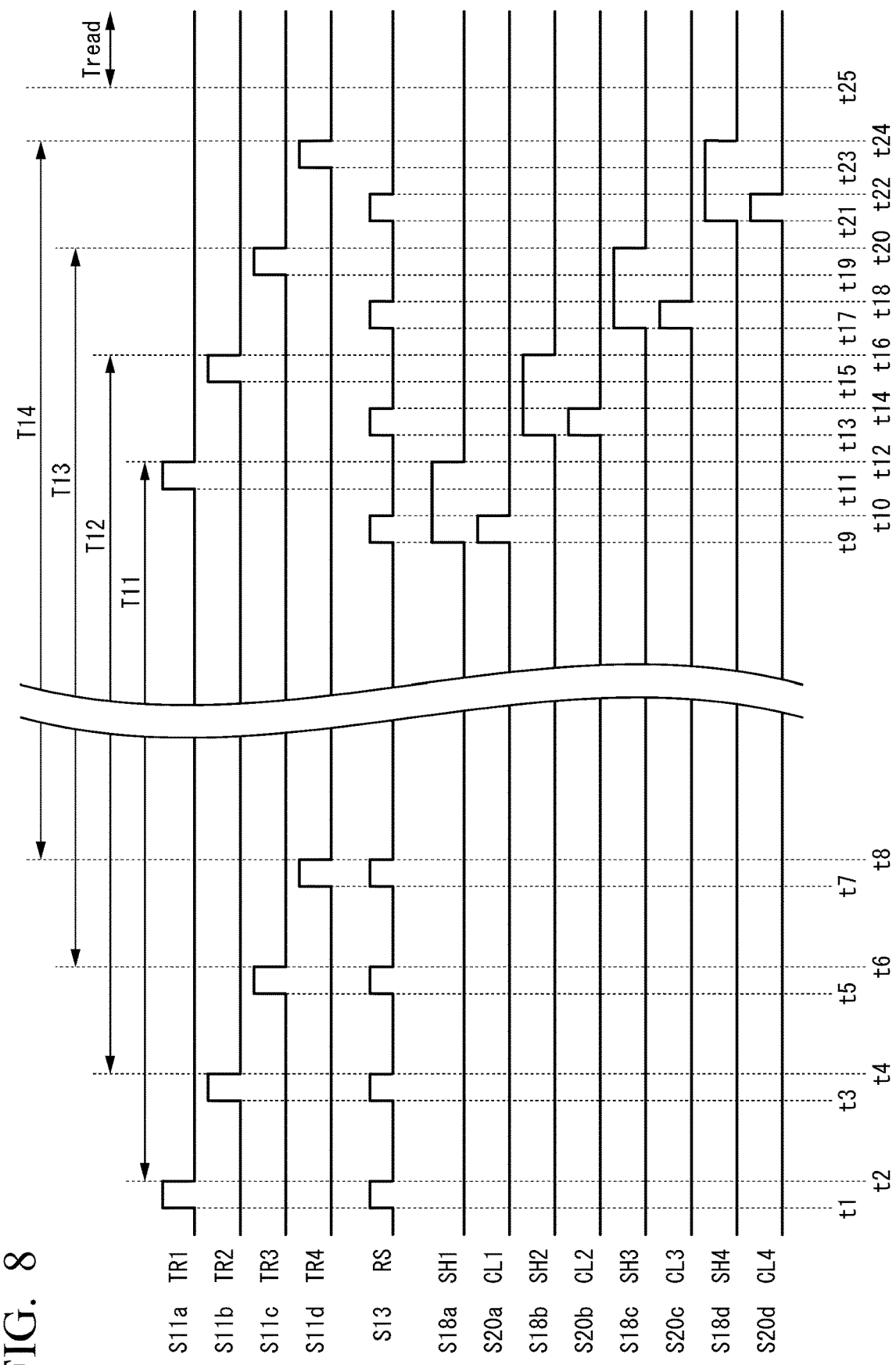
FIG. 8 is a timing chart showing an operation of a solid-state imaging device according to the second embodiment of the present invention.

FIG. 8 shows an operation of the solid-state imaging device 202. In FIG. 8, the same part as that shown in FIG. 5 will not be described. In the operation shown in FIG. 8, pixel signals of all the pixels 1 are read through the global-electronic-shutter operation.

Before a time point t1, the level of each pulse is the L level. At the time point t1, the transfer transistor 11a and the first reset transistor 13 are turned on and the photoelectric conversion element 10a is reset. At a time point t2 after the time point t1, the transfer transistor 11a and the first reset transistor 13 are turned off. At the time point t2, the photoelectric conversion element 10a starts accumulation of electric charge, that is, generation of the pixel signal.

At a time point t3 after the time point t2, the transfer transistor 11b and the first reset transistor 13 are turned on and the photoelectric conversion element 10b is reset. At a time point t4 after the time point t3, the transfer transistor 11b and the first reset transistor 13 are turned off. At the time point t4, the photoelectric conversion element 10b starts accumulation of electric charge, that is, generation of the pixel signal.

At a time point t5 after the time point t4, the transfer transistor 11c and the first reset transistor 13 are turned on and the photoelectric conversion element 10c is reset. At a time point t6 after the time point t5, the transfer transistor 11c and the first reset transistor 13 are turned off. At the time point t6, the photoelectric conversion element 10c starts accumulation of electric charge, that is, generation of the pixel signal.

At a time point t7 after the time point t6, the transfer transistor 11d and the first reset transistor 13 are turned on and the photoelectric conversion element 10d is reset. At a time point t8 after the time point t7, the transfer transistor 11d and the first reset transistor 13 are turned off. At the time point t8, the photoelectric conversion element 10d starts accumulation of electric charge, that is, generation of the pixel signal.

At a time point t9 after the time point t8, the first reset transistor 13 is turned on and the FD 12 is reset. At a time point t10 after the time point t9, the first reset transistor 13 is turned off.

At the time point t9, the sample transistor 18a and the second reset transistor 20a are turned on and the clamp capacitor 17 and the memory 19a are reset. At the time point t10, the second reset transistor 20a is turned off.

At a time point t11 after the time point t10, the transfer transistor 11a is turned on. At the time point t11, the electric charge output from the photoelectric conversion element 10a is transferred to the FD 12.

At a time point t12 after the time point t11, the transfer transistor 11a is turned off. At the time point t12, the photoelectric conversion element 10a completes accumulation of electric charge, that is, generation of the pixel signal.

In an exposure period T11, electric charge that is based on light incident to the photoelectric conversion element 10a is accumulated in the photoelectric conversion element 10a. The exposure period T11 is a period from the time point t2 to the time point t12.

At the time point t11, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18a samples the voltage of the second end of the clamp capacitor 17. At the time point t12, the memory 19a holds the pixel signal.

At a time point t13 after the time point t12, the first reset transistor 13 is turned on and the FD 12 is reset. At a time point t14 after the time point t13, the first reset transistor 13 is turned off.

At the time point t13, the sample transistor 18b and the second reset transistor 20b are turned on and the clamp capacitor 17 and the memory 19b are reset. At the time point t14, the second reset transistor 20b is turned off.

At a time point t15 after the time point t14, the transfer transistor 11b is turned on. At the time point t15, the electric charge output from the photoelectric conversion element 10b is transferred to the FD 12.

At a time point t16 after the time point t15, the transfer transistor 11b is turned off. At the time point t16, the photoelectric conversion element 10b completes accumulation of electric charge, that is, generation of the pixel signal.

In an exposure period T12, electric charge that is based on light incident to the photoelectric conversion element 10b is accumulated in the photoelectric conversion element 10b. The exposure period T12 is a period from the time point t4 to the time point t16.

At the time point t15, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18b samples the voltage of the second end of the clamp capacitor 17. At the time point t16, the memory 19b holds the pixel signal.

At a time point t17 after the time point t16, the first reset transistor 13 is turned on and the FD 12 is reset. At a time point t18 after the time point t17, the first reset transistor 13 is turned off.

At the time point t17, the sample transistor 18c and the second reset transistor 20c are turned on and the clamp capacitor 17 and the memory 19c are reset. At the time point t18, the second reset transistor 20c is turned off.

At a time point t19 after the time point t18, the transfer transistor 11c is turned on. At the time point t19, the electric charge output from the photoelectric conversion element 10c is transferred to the FD 12.

At a time point t20 after the time point t19, the transfer transistor 11c is turned off. At the time point t20, the photoelectric conversion element 10c completes accumulation of electric charge, that is, generation of the pixel signal.

In an exposure period T13, electric charge that is based on light incident to the photoelectric conversion element 10c is accumulated in the photoelectric conversion element 10c. The exposure period T13 is a period from the time point t6 to the time point t20.

At the time point t19, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18c samples the voltage of the second end of the clamp capacitor 17. At the time point t20, the memory 19c holds the pixel signal.

At a time point t21 after the time point t20, the first reset transistor 13 is turned on and the FD 12 is reset. At a time point t22 after the time point t21, the first reset transistor 13 is turned off.

At the time point t21, the sample transistor 18d and the second reset transistor 20d are turned on and the clamp capacitor 17 and the memory 19d are reset. At the time point t22, the second reset transistor 20d is turned off.

At a time point t23 after the time point t22, the transfer transistor 11d is turned on. At the time point t23, the electric charge output from the photoelectric conversion element 10d is transferred to the FD 12.

At a time point t24 after the time point t23, the transfer transistor 11d is turned off. At the time point t24, the photoelectric conversion element 10d completes accumulation of electric charge, that is, generation of the pixel signal.

In an exposure period T14, electric charge that is based on light incident to the photoelectric conversion element 10d is accumulated in the photoelectric conversion element 10d. The exposure period T14 is a period from the time point t8 to the time point t24.

At the time point t23, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18d samples the voltage of the second end of the clamp capacitor 17. At the time point t24, the memory 19d holds the pixel signal.

The operation shown in FIG. 8 is simultaneously performed in all the pixel groups 1b disposed in the solid-state imaging device 202. For this reason, the global-electronic-shutter operation is realized.

In a reading period Tread, the pixel signals held in the memory 19a, the memory 19b, the memory 19c, and the memory 19d are read. The reading period Tread is started at a time point t25 after the time point t24.

The solid-state imaging device 202 according to the second embodiment operates in any one of a first mode and a second mode. The solid-state imaging device 202 is able to switch the mode to be set in the solid-state imaging device 202 between the first mode and the second mode. The solid-state imaging device 202 obtains the high-sensitivity signal and the low-sensitivity signal in the first mode (FIG. 5). The solid-state imaging device 202 obtains the pixel signals of all the pixels 1 in the second mode (FIG. 8). The solid-state imaging device 202 is able to perform optimal imaging in accordance with the situation.

Third Embodiment

A third embodiment of the present invention will be described by using the solid-state imaging device 202 shown in FIG. 2. The solid-state imaging device 202 according to the third embodiment includes the pixel group 1b shown in FIG. 7. In the third embodiment, each of a plurality of pixel groups 1b includes at least four photoelectric conversion elements included in a plurality of photoelectric conversion elements. The at least four photoelectric conversion elements are disposed in at least two consecutive rows and at least two consecutive columns.

The at least four photoelectric conversion elements include at least two first photoelectric conversion elements and at least two second photoelectric conversion elements. The first photoelectric conversion element generates first electric charge as a high-sensitivity signal. The second photoelectric conversion element generates second electric charge as a low-sensitivity signal. A transfer transistor sequentially transfers at least two pieces of second electric charge generated by the at least two second photoelectric conversion elements to the FD 12. A second switch sequentially transfers the at least two pieces of second electric charge held in the FD 12 from the FD 12 to a second memory. The second memory separately stores at least two second pixel signals that are based on the at least two pieces of second electric charge. For example, the second memory is a group of at least two memories, each of which stores the second electric charge. The second memory may include at least two storage regions therein, each of which stores the second electric charge.

In the following example, the second photoelectric conversion elements are the photoelectric conversion elements 10b and 10c. The transfer transistors 11b and 11c sequentially transfer the two pieces of second electric charge generated by the photoelectric conversion elements 10b and 10c to the FD 12. In the following example, the second switch is the sample transistors 18b and 18c. In the following example, the second memory is the memories 19b and 19c. The sample transistors 18b and 18c sequentially transfer the two pieces of second electric charge held in the FD 12 to the memories 19b and 19c. The memories 19b and 19c separately store two second pixel signals.

Figure 9:
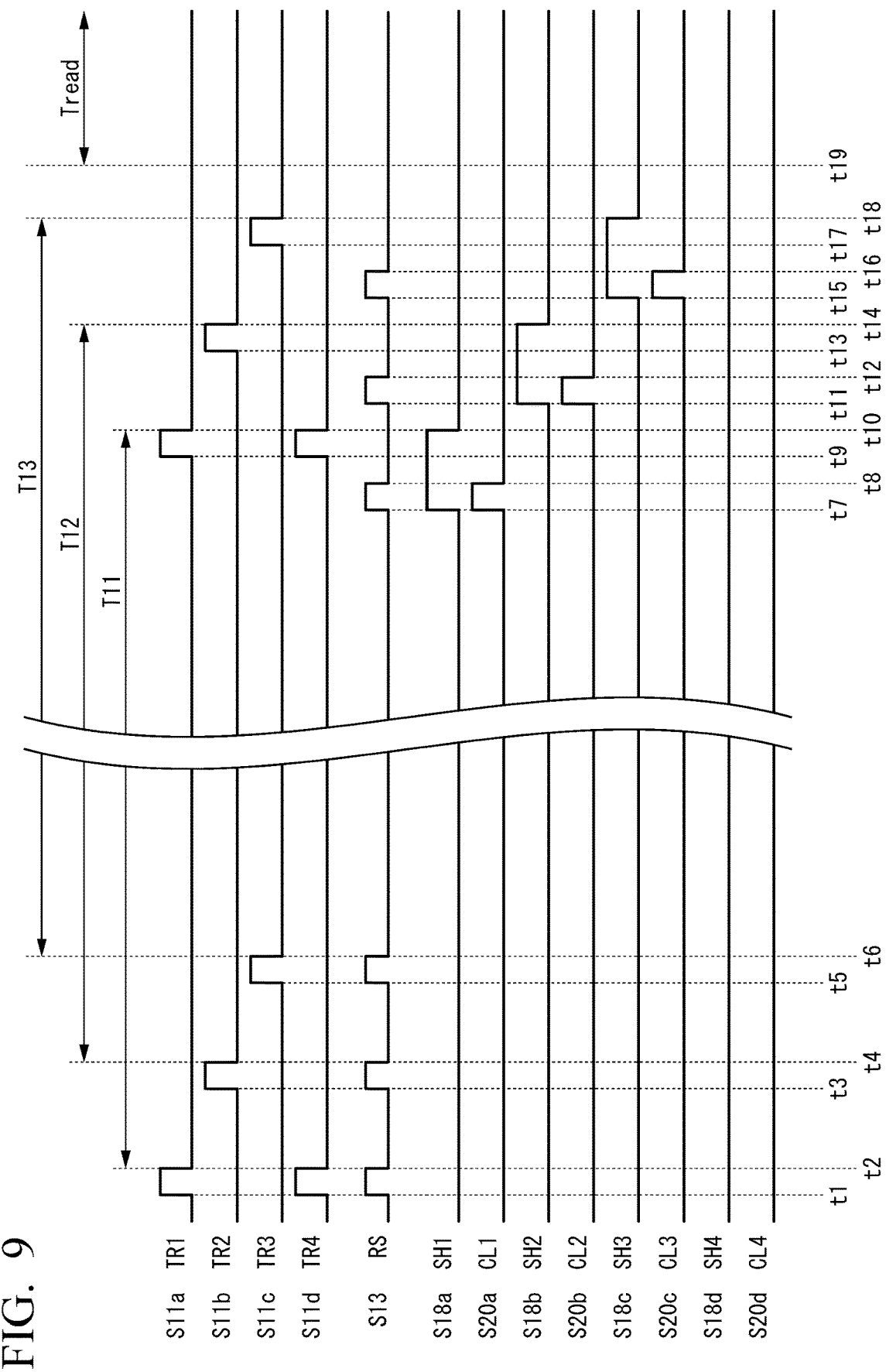
FIG. 9 is a timing chart showing an operation of a solid-state imaging device according to a third embodiment of the present invention.

FIG. 9 shows an operation of the solid-state imaging device 202. In FIG. 9, the same part as that shown in FIG. 5 will not be described. In the operation shown in FIG. 9, the photoelectric conversion elements 10a and 10d generate the high-sensitivity signal and the signal is held in the memory 19a. In the operation shown in FIG. 9, the photoelectric conversion elements 10b and 10c generate the low-sensitivity signal and the signal is held in the memories 19b and 19c.

Before a time point t1, the level of each pulse is the L (Low) level. The operation of the solid-state imaging device 202 from the time point t1 to a time point t5 is the same as the operation of the solid-state imaging device 202 from the time point t1 to the time point t5 shown in FIG. 5. At the time point t2, the photoelectric conversion element 10a and the photoelectric conversion element 10d start accumulation of electric charge, that is, generation of the pixel signal (high-sensitivity signal).

The operation of the solid-state imaging device 202 from a time point t3 to a time point t4 is the same as the operation of the solid-state imaging device 202 from the time point t3 to the time point t4 shown in FIG. 5. At the time point t4, the photoelectric conversion element 10b starts accumulation of electric charge, that is, generation of the pixel signal (low-sensitivity signal).

At a time point t5 after the time point t4, the transfer transistor 11c and the first reset transistor 13 are turned on and the photoelectric conversion element 10c is reset. At a time point t6 after the time point t5, the transfer transistor 11c and the first reset transistor 13 are turned off. At the time point t6, the photoelectric conversion element 10c starts accumulation of electric charge, that is, generation of the pixel signal (low-sensitivity signal).

The operation of the solid-state imaging device 202 from a time point t7 to a time point t10 is the same as the operation of the solid-state imaging device 202 from the time point t5 to the time point t8 shown in FIG. 5. At a time point t9, the electric charge output from each of the photoelectric conversion element 10a and the photoelectric conversion element 10d is transferred to the FD 12. At the time point t10, the photoelectric conversion element 10a and the photoelectric conversion element 10d complete accumulation of electric charge, that is, generation of the pixel signal.

In an exposure period T11, electric charge that is based on light incident to each of the photoelectric conversion element 10a and the photoelectric conversion element 10d is accumulated in each of the photoelectric conversion element 10a and the photoelectric conversion element 10d. The exposure period T11 is a period from the time point t2 to the time point t10. The electric charge output from the photoelectric conversion element 10a and the electric charge output from the photoelectric conversion element 10d are added in the FD 12 and held in the FD 12. At the time point t10, the memory 19a holds the pixel signal (high-sensitivity signal).

The operation of the solid-state imaging device 202 from a time point t11 to a time point t14 is the same as the operation of the solid-state imaging device 202 from the time point t9 to the time point t12 shown in FIG. 5. At a time point t13, the electric charge output from the photoelectric conversion element 10b is transferred to the FD 12. At a time point t14, the photoelectric conversion element 10b completes accumulation of electric charge, that is, generation of the pixel signal.

In an exposure period T12, electric charge that is based on light incident to the photoelectric conversion element 10b is accumulated in the photoelectric conversion element 10b. The exposure period T12 is a period from the time point t4 to the time point t14. The electric charge output from the photoelectric conversion element 10b is held in the FD 12. At the time point t14, the memory 19b holds the pixel signal (low-sensitivity signal).

At a time point t15 after the time point t14, the first reset transistor 13 is turned on and the FD 12 is reset. At a time point t16 after the time point t15, the first reset transistor 13 is turned off.

At the time point t15, the sample transistor 18c and the second reset transistor 20c are turned on and the clamp capacitor 17 and the memory 19c are reset. At the time point t16, the second reset transistor 20c is turned off.

At a time point t17 after the time point t16, the transfer transistor 11c is turned on. At the time point t17, the electric charge output from the photoelectric conversion element 10c is transferred to the FD 12.

At a time point t18 after the time point t17, the transfer transistor 11c is turned off. At the time point t18, the photoelectric conversion element 10c completes accumulation of electric charge, that is, generation of the pixel signal.

In an exposure period T13, electric charge that is based on light incident to the photoelectric conversion element 10c is accumulated in the photoelectric conversion element 10c. The exposure period T13 is a period from the time point t6 to the time point t18. The electric charge output from the photoelectric conversion element 10c is held in the FD 12. At the time point t18, the memory 19c holds the pixel signal (low-sensitivity signal).

At the time point t17, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18c samples the voltage of the second end of the clamp capacitor 17. At the time point t18, the memory 19c holds the pixel signal (low-sensitivity signal).

The operation shown in FIG. 9 is simultaneously performed in all the pixel groups 1b disposed in the solid-state imaging device 202. For this reason, the global-electronic-shutter operation is realized.

In a reading period Tread, the pixel signals held in the memories 19a, 19b, and 19c are read. The reading period Tread is started at a time point t19 after the time point t18. The second amplification transistor 21a amplifies the voltage that is based on the pixel signal held in the memory 19a and outputs the amplified voltage as the first pixel signal. The selection transistor 22a outputs the first pixel signal output from the second amplification transistor 21a to the vertical signal line 9. The second amplification transistor 21b amplifies the voltage that is based on the pixel signal held in the memory 19b and outputs the amplified voltage as the second pixel signal. The selection transistor 22b outputs the second pixel signal output from the second amplification transistor 21b to the vertical signal line 9. The second amplification transistor 21c amplifies the voltage that is based on the pixel signal held in the memory 19c and outputs the amplified voltage as the second pixel signal. The selection transistor 22c outputs the second pixel signal output from the second amplification transistor 21c to the vertical signal line 9.

The timing at which the first pixel signal is output to the vertical signal line 9 and the timing at which the second pixel signal is output to the vertical signal line 9 are different from each other. The timings at which the two second pixel signals are output to the vertical signal line 9 are different from each other.

At the time point t13 shown in FIG. 9, the transfer transistor 11b transfers the second electric charge generated by the photoelectric conversion element 10b to the FD 12. At the time point t13, the sample transistor 18b transfers the second electric charge held in the FD 12 to the memory 19b. At the time point t14, the memory 19b stores the second pixel signal that is based on the second electric charge.

At the time point t17 shown in FIG. 9, the transfer transistor 11c transfers the second electric charge generated by the photoelectric conversion element 10c to the FD 12. At the time point t17, the sample transistor 18c transfers the second electric charge held in the FD 12 to the memory 19c. At the time point t18, the memory 19c stores the second pixel signal that is based on the second electric charge.

In a case in which one pixel group 1b includes five or more photoelectric conversion elements, three or more second photoelectric conversion elements may generate three or more pieces of second electric charge. The transfer transistor may sequentially transfer the three or more pieces of second electric charge generated by the three or more second photoelectric conversion elements to the FD 12. The second switch may sequentially transfer the three or more pieces of second electric charge held in the FD 12 to the second memory. The second memory may separately store three or more second pixel signals that are based on the three or more pieces of second electric charge.

In the operation shown in FIG. 9, the memory unit 8d does not hold the pixel signal. For this reason, the pixel group 1b may not include the memory unit 8d.

The high-sensitivity signal is obtained by adding the electric charge of the photoelectric conversion element 10a and the electric charge of the photoelectric conversion element 10d. The low-sensitivity signal is obtained on the basis of the electric charge of only the photoelectric conversion element 10b and the low-sensitivity signal is obtained on the basis of the electric charge of only the photoelectric conversion element 10c.

The solid-state imaging device 202 outputs the first image signal that is based on the high-sensitivity signal and the second image signal that is based on the low-sensitivity signal. The first image-processing unit 203a and the second image-processing unit 203b may average the two second image signals output from the solid-state imaging device 202. The solid-state imaging device 202 may include a signal processing circuit that averages the two second image signals.

The two second image signals are output from the same pixel group 1b. The centroid position of the two first photoelectric conversion elements is the same as the centroid position of the pixel group 1b. The centroid position of the two second photoelectric conversion elements is the same as the centroid position of the pixel group 1b. For this reason, the centroid position of the two first photoelectric conversion elements in which the first electric charge is obtained is the same as the centroid position of the two second photoelectric conversion elements in which the second electric charge is obtained. In other words, the pixel centroid position of the first pixel signal (high-sensitivity signal) is the same as the pixel centroid position of the second pixel signal (low-sensitivity signal).

The first image-processing unit 203a and the second image-processing unit 203b combine the first image signal and the second image signal. The first image signal is generated on the basis of the first pixel signal and the second image signal is generated on the basis of the second pixel signal. Since the pixel position of the first pixel signal is the same as the pixel position of the second pixel signal, a high-quality combined image is obtained.

Fourth Embodiment

Figure 10:
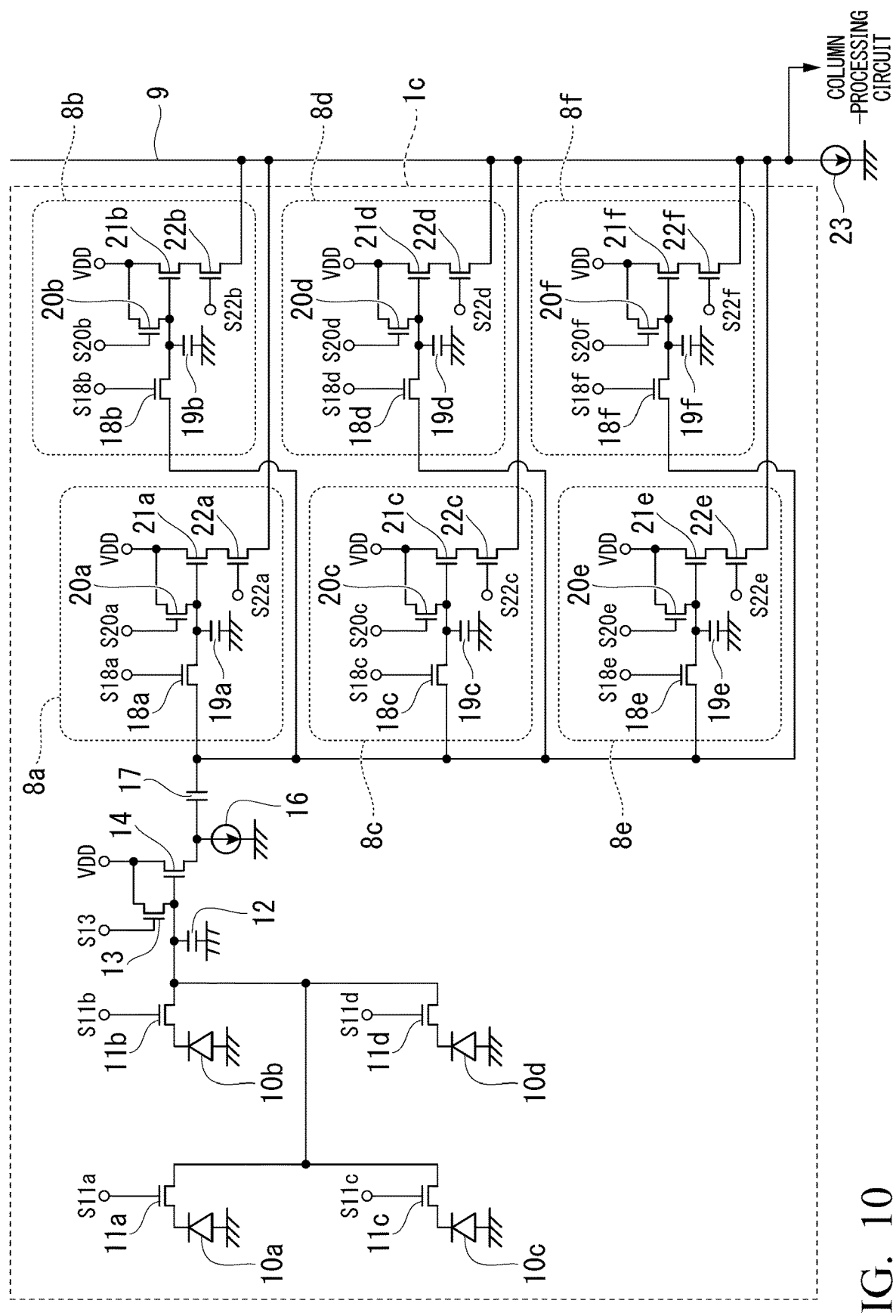
FIG. 10 is a circuit diagram showing a configuration of a pixel group according to a fourth embodiment of the present invention.

A fourth embodiment of the present invention will be described by using the solid-state imaging device 202 shown in FIG. 2. In the fourth embodiment, the pixel group 1b shown in FIG. 7 is changed to a pixel group 1c shown in FIG. 10. FIG. 10 shows a configuration of the pixel group 1c. The same configuration as that shown in FIG. 7 will not be described.

The pixel group 1c includes a memory unit 8e and a memory unit 8f in addition to the configuration of the pixel group 1b shown in FIG. 7. The memory unit 8e includes a sample transistor 18e, a memory 19e, a second reset transistor 20e, a second amplification transistor 21e, and a selection transistor 22e. The memory unit 8f includes a sample transistor 18f, a memory 19f, a second reset transistor 20f, a second amplification transistor 21f, and a selection transistor 22f. The configuration of each of the memory unit 8e and the memory unit 8f is similar to the configuration of the memory unit 8a. The position at which each circuit element shown in FIG. 10 is disposed does not necessarily match the position at which the element is actually disposed.

A sample pulse S18e is supplied from the vertical scanning circuit 3 to a gate of the sample transistor 18e. A second reset pulse S20e is supplied from the vertical scanning circuit 3 to a gate of the second reset transistor 20e. A selection pulse S22e is supplied from the vertical scanning circuit 3 to a gate of the selection transistor 22e.

A sample pulse S18f is supplied from the vertical scanning circuit 3 to a gate of the sample transistor 18f. A second reset pulse S20f is supplied from the vertical scanning circuit 3 to a gate of the second reset transistor 20f. A selection pulse S22f is supplied from the vertical scanning circuit 3 to a gate of the selection transistor 22f.

The solid-state imaging device 202 performs multiple times of imaging. In each of the multiple times of imaging, a first photoelectric conversion element generates first electric charge. In each of the multiple times of imaging, a second photoelectric conversion element generates second electric charge. In each of the multiple times of imaging, a transfer transistor transfers the first electric charge and the second electric charge to the FD 12. In each of the multiple times of imaging, a first switch transfers the first electric charge held in the FD 12 from the FD 12 to a first memory. In each of the multiple times of imaging, a second switch transfers the second electric charge held in the FD 12 from the FD 12 to a second memory. In each of the multiple times of imaging, the first memory stores a first pixel signal that is based on the first electric charge. In each of the multiple times of imaging, the second memory stores a second pixel signal that is based on the second electric charge. In each of a plurality of pixel groups 1c, the combination of at least two first photoelectric conversion elements is different between the multiple times of imaging. In each of a plurality of pixel groups 1c, the combination of at least two second photoelectric conversion elements is different between the multiple times of imaging.

In the following example, the solid-state imaging device 202 performs imaging twice. The first photoelectric conversion element in the imaging of the first time is the photoelectric conversion elements 10a and 10d. The second photoelectric conversion element in the imaging of the first time is the photoelectric conversion elements 10b and 10c.

In the imaging of the first time, the transfer transistors 11a and 11d transfer the first electric charge generated by the photoelectric conversion elements 10a and 10d to the FD 12. In the imaging of the first time, the sample transistor 18a transfers a signal that is based on the first electric charge held in the FD 12 to the memory 19a. In the imaging of the first time, the memory 19a stores the first pixel signal.

In the imaging of the first time, the transfer transistors 11b and 11c transfer the second electric charge generated by the photoelectric conversion elements 10b and 10c to the FD 12. In the imaging of the first time, the sample transistors 18b and 18c transfer a signal that is based on the second electric charge held in the FD 12 to the memories 19b and 19c. In the imaging of the first time, the memories 19b and 19c store the second pixel signal.

The first photoelectric conversion element in the imaging of the second time is the photoelectric conversion elements 10b and 10c. The second photoelectric conversion element in the imaging of the second time is the photoelectric conversion elements 10a and 10d.

In the imaging of the second time, the transfer transistors 11b and 11c transfer the first electric charge generated by the photoelectric conversion elements 10b and 10c to the FD 12. In the imaging of the second time, the sample transistor 18d transfers a signal that is based on the first electric charge held in the FD 12 to the memory 19d. In the imaging of the second time, the memory 19d stores the first pixel signal.

In the imaging of the second time, the transfer transistors 11a and 11d transfer the second electric charge generated by the photoelectric conversion elements 10a and 10d to the FD 12. In the imaging of the second time, the sample transistors 18e and 18f transfer a signal that is based on the second electric charge held in the FD 12 to the memories 19e and 19f. In the imaging of the second time, the memories 19e and 19f store the second pixel signal.

Figure 11:
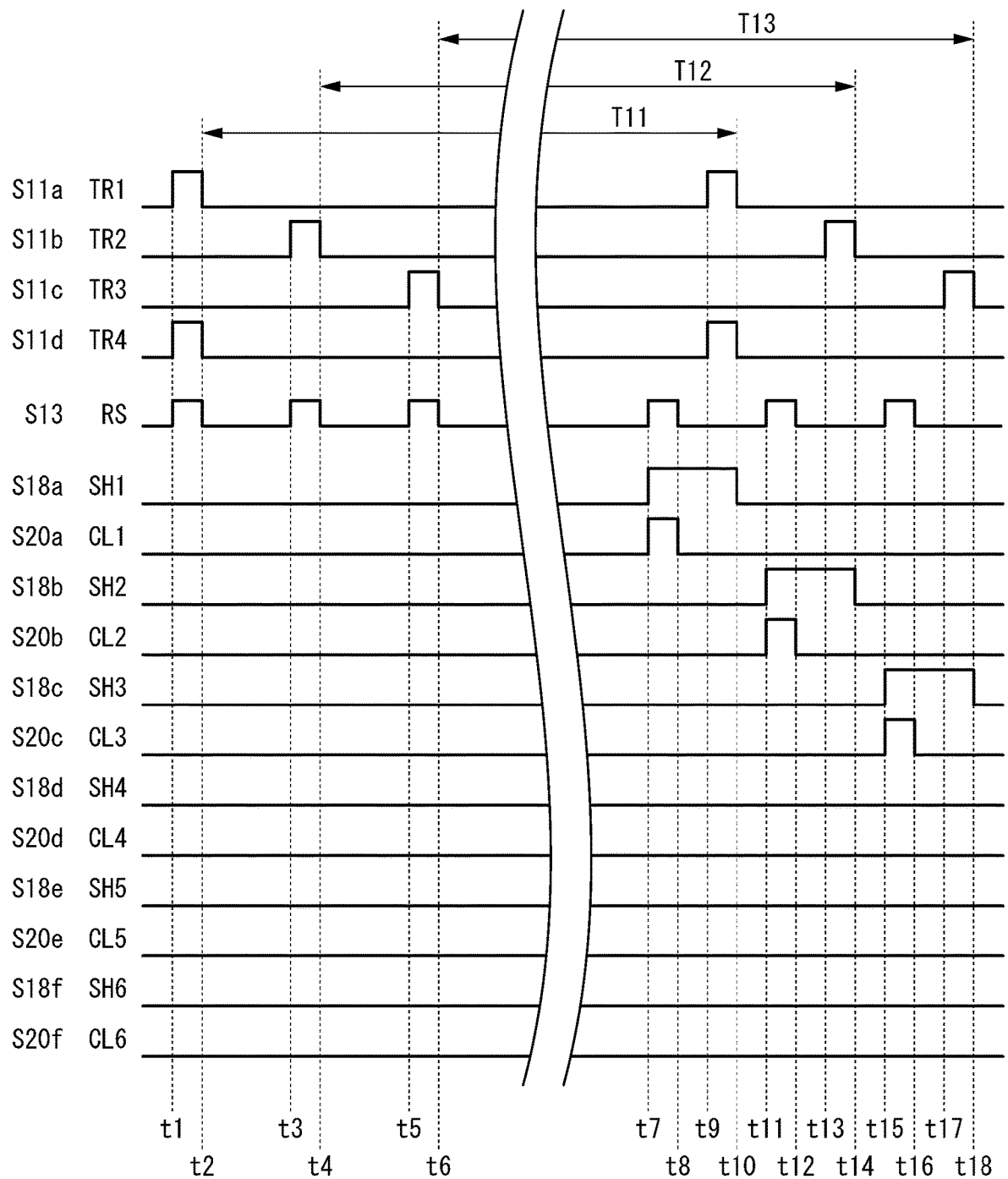
FIG. 11 is a timing chart showing an operation of the solid-state imaging device according to the fourth embodiment of the present invention.
Figure 12:
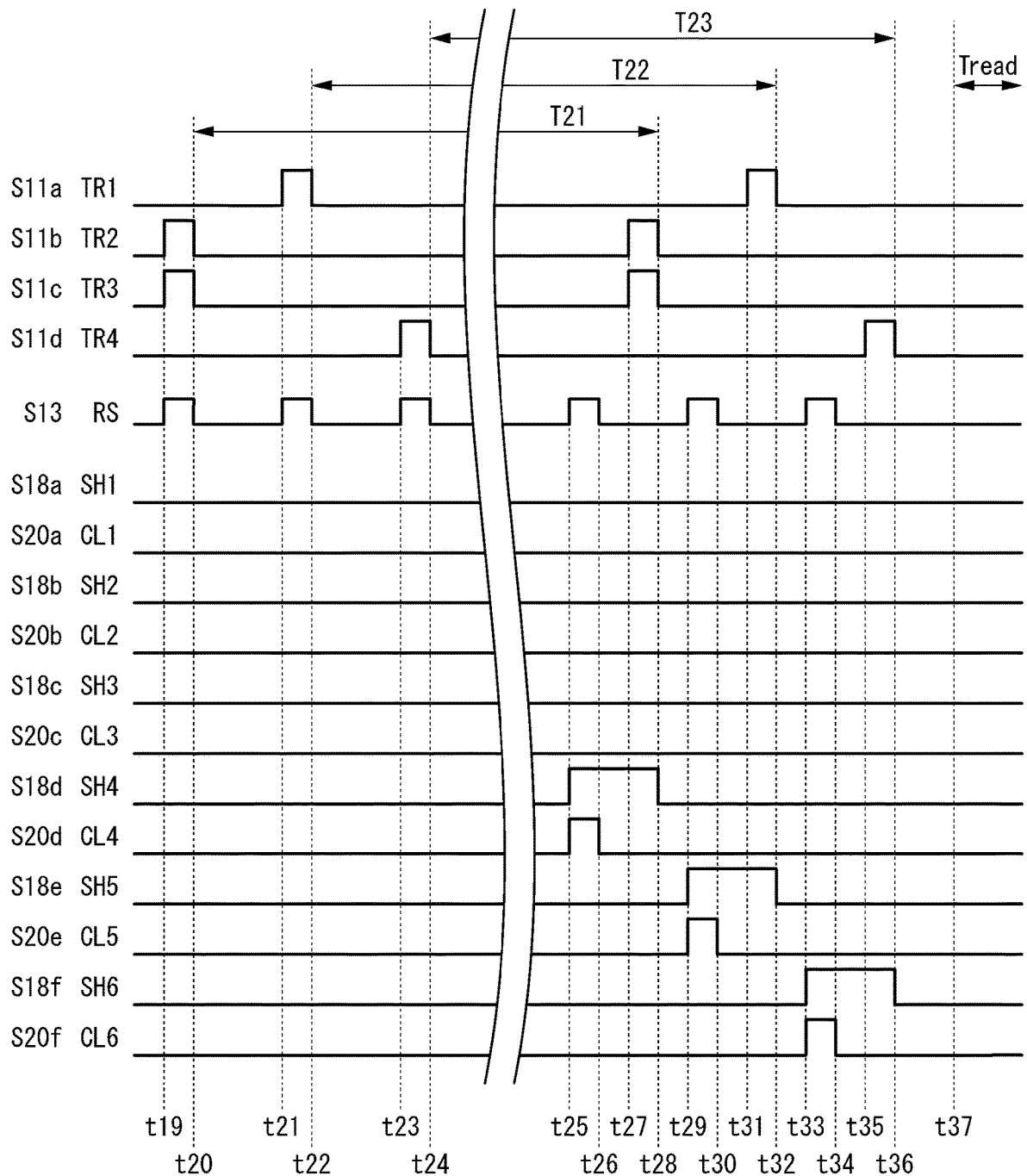
FIG. 12 is a timing chart showing an operation of the solid-state imaging device according to the fourth embodiment of the present invention.

FIG. 11 and FIG. 12 show an operation of the solid-state imaging device 202. In FIG. 11 and FIG. 12, the same part as that shown in FIG. 9 will not be described.

FIG. 11 shows an operation of the solid-state imaging device 202 in the imaging of the first time. In the operation shown in FIG. 11, the photoelectric conversion elements 10a and 10d generate the high-sensitivity signal and the signal is held in the memory 19a. In the operation shown in FIG. 11, the photoelectric conversion elements 10b and 10c generate the low-sensitivity signal and the signal is held in the memories 19b and 19c.

FIG. 12 shows an operation of the solid-state imaging device 202 in the imaging of the second time. In the operation shown in FIG. 12, the photoelectric conversion elements 10b and 10c generate the high-sensitivity signal and the signal is held in the memory 19d. In the operation shown in FIG. 12, the photoelectric conversion elements 10a and 10d generate the low-sensitivity signal and the signal is held in the memories 19e and 19f.

The operation of the solid-state imaging device 202 from a time point t1 to a time point t18 shown in FIG. 11 is the same as the operation of the solid-state imaging device 202 from the time point t1 to the time point t18 shown in FIG. 9.

At a time point t19 after the time point t18, the transfer transistor 11b, the transfer transistor 11c, and the first reset transistor 13 are turned on and the photoelectric conversion element 10b and the photoelectric conversion element 10c are reset. At a time point t20 after the time point t19, the transfer transistor 11b, the transfer transistor 11c, and the first reset transistor 13 are turned off. At the time point t20, the photoelectric conversion element 10b and the photoelectric conversion element 10c start accumulation of electric charge, that is, generation of the pixel signal (high-sensitivity signal).

At a time point t21 after the time point t20, the transfer transistor 11a and the first reset transistor 13 are turned on and the photoelectric conversion element 10a is reset. At a time point t22 after the time point t21, the transfer transistor 11a and the first reset transistor 13 are turned off. At the time point t22, the photoelectric conversion element 10a starts accumulation of electric charge, that is, generation of the pixel signal (low-sensitivity signal).

At a time point t23 after the time point t22, the transfer transistor 11d and the first reset transistor 13 are turned on and the photoelectric conversion element 10d is reset. At a time point t24 after the time point t23, the transfer transistor 11d and the first reset transistor 13 are turned off. At the time point t24, the photoelectric conversion element 10d starts accumulation of electric charge, that is, generation of the pixel signal (low-sensitivity signal).

At a time point t25 after the time point t24, the first reset transistor 13 is turned on and the FD 12 is reset. At a time point t26 after the time point t25, the first reset transistor 13 is turned off.

At the time point t25, the sample transistor 18d and the second reset transistor 20d are turned on and the clamp capacitor 17 and the memory 19d are reset. At the time point t26, the second reset transistor 20d is turned off.

At a time point t27 after the time point t26, the transfer transistor 11b and the transfer transistor 11c are turned on. At the time point t27, the electric charge output from each of the photoelectric conversion element 10b and the photoelectric conversion element 10c is transferred to the FD 12.

At a time point t28 after the time point t27, the transfer transistor 11b and the transfer transistor 11c are turned off. At the time point t28, the photoelectric conversion element 10b and the photoelectric conversion element 10c complete accumulation of electric charge, that is, generation of the pixel signal.

In an exposure period T21, electric charge that is based on light incident to each of the photoelectric conversion element 10b and the photoelectric conversion element 10c is accumulated in each of the photoelectric conversion element 10b and the photoelectric conversion element 10c. The exposure period T21 is a period from the time point t20 to the time point t28. The electric charge output from the photoelectric conversion element 10b and the electric charge output from the photoelectric conversion element 10c are added in the FD 12 and held in the FD 12.

At the time point t27, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18d samples the voltage of the second end of the clamp capacitor 17. At the time point t28, the memory 19d holds the pixel signal (high-sensitivity signal).

At a time point t29 after the time point t28, the first reset transistor 13 is turned on and the FD 12 is reset. At a time point t30 after the time point t29, the first reset transistor 13 is turned off.

At the time point t29, the sample transistor 18e and the second reset transistor 20e are turned on and the clamp capacitor 17 and the memory 19e are reset. At the time point t30, the second reset transistor 20e is turned off.

At a time point t31 after the time point t30, the transfer transistor 11a is turned on. At the time point t31, the electric charge output from the photoelectric conversion element 10a is transferred to the FD 12.

At a time point t32 after the time point t31, the transfer transistor 11a is turned off. At the time point t32, the photoelectric conversion element 10a completes accumulation of electric charge, that is, generation of the pixel signal.

In an exposure period T22, electric charge that is based on light incident to the photoelectric conversion element 10a is accumulated in the photoelectric conversion element 10a. The exposure period T22 is a period from the time point t22 to the time point t32. The electric charge output from the photoelectric conversion element 10a is held in the FD 12.

At the time point t31, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18e samples the voltage of the second end of the clamp capacitor 17. At the time point t32, the memory 19e holds the pixel signal (low-sensitivity signal).

At a time point t33 after the time point t32, the first reset transistor 13 is turned on and the FD 12 is reset. At a time point t34 after the time point t33, the first reset transistor 13 is turned off.

At the time point t33, the sample transistor 18f and the second reset transistor 20f are turned on and the clamp capacitor 17 and the memory 19f are reset. At the time point t34, the second reset transistor 20f is turned off.

At a time point t35 after the time point t34, the transfer transistor 11d is turned on. At the time point t35, the electric charge output from the photoelectric conversion element 10d is transferred to the FD 12.

At a time point t36 after the time point t35, the transfer transistor 11d is turned off. At the time point t36, the photoelectric conversion element 10d completes accumulation of electric charge, that is, generation of the pixel signal.

In an exposure period T23, electric charge that is based on light incident to the photoelectric conversion element 10d is accumulated in the photoelectric conversion element 10d. The exposure period T23 is a period from the time point t24 to the time point t36. The electric charge output from the photoelectric conversion element 10d is held in the FD 12.

At the time point t35, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18f samples the voltage of the second end of the clamp capacitor 17. At the time point t36, the memory 19f holds the pixel signal (low-sensitivity signal).

The operation shown in FIG. 11 and FIG. 12 is simultaneously performed in all the pixel groups 1c disposed in the solid-state imaging device 202. For this reason, the global-electronic-shutter operation is realized.

In a reading period Tread, the pixel signals held in the memories 19a, 19b, 19c, 19d, 19e, and 19f are read. The reading period Tread is started at a time point t37 after the time point t36. The second amplification transistor 21a amplifies the voltage that is based on the pixel signal held in the memory 19a and outputs the amplified voltage as the first pixel signal. The selection transistor 22a outputs the first pixel signal output from the second amplification transistor 21a to the vertical signal line 9. The second amplification transistor 21b amplifies the voltage that is based on the pixel signal held in the memory 19b and outputs the amplified voltage as the second pixel signal. The selection transistor 22b outputs the second pixel signal output from the second amplification transistor 21b to the vertical signal line 9. The second amplification transistor 21c amplifies the voltage that is based on the pixel signal held in the memory 19c and outputs the amplified voltage as the second pixel signal. The selection transistor 22c outputs the second pixel signal output from the second amplification transistor 21c to the vertical signal line 9.

The second amplification transistor 21d amplifies the voltage that is based on the pixel signal held in the memory 19d and outputs the amplified voltage as the first pixel signal. The selection transistor 22d outputs the first pixel signal output from the second amplification transistor 21d to the vertical signal line 9. The second amplification transistor 21e amplifies the voltage that is based on the pixel signal held in the memory 19e and outputs the amplified voltage as the second pixel signal. The selection transistor 22e outputs the second pixel signal output from the second amplification transistor 21e to the vertical signal line 9. The second amplification transistor 21f amplifies the voltage that is based on the pixel signal held in the memory 19f and outputs the amplified voltage as the second pixel signal. The selection transistor 22f outputs the second pixel signal output from the second amplification transistor 21f to the vertical signal line 9.

In the operation shown in FIG. 11 and FIG. 12, the solid-state imaging device 202 performs imaging twice. In the imaging of the first time, the first photoelectric conversion elements 10a and 10d generate first electric charge. In the imaging of the first time, the first photoelectric conversion elements 10b and 10c generate second electric charge. In the imaging of the first time, the transfer transistors 11a and 11d transfer a signal that is based on the first electric charge to the FD 12 and the transfer transistors 11b and 11e transfer a signal that is based on the second electric charge to the FD 12 (the time point t9, the time point t13, and the time point t17). In the imaging of the first time, the sample transistor 18a transfers the signal that is based on the first electric charge from the FD 12 to the memory 19a (the time point t9). In the imaging of the first time, the sample transistors 18b and 18c transfer the signal that is based on the second electric charge from the FD 12 to the memories 19b and 19c (the time point t13 and the time point t17). In the imaging of the first time, the memory 19a stores a first pixel signal that is based on the first electric charge (the time point t10). In the imaging of the first time, the memories 19b and 19c store a second pixel signal that is based on the second electric charge (the time point t14 and the time point t18).

In the imaging of the second time, the first photoelectric conversion elements 10b and 10c generate first electric charge. In the imaging of the second time, the first photoelectric conversion elements 10a and 10d generate second electric charge. In the imaging of the second time, the transfer transistors 11b and 11c transfer a signal that is based on the first electric charge to the FD 12 and the transfer transistors 11a and 11d transfer a signal that is based on the second electric charge to the FD 12 (the time point t27, the time point t31, and the time point t35). In the imaging of the second time, the sample transistor 18d transfers the signal that is based on the first electric charge from the FD 12 to the memory 19d (the time point t27). In the imaging of the second time, the sample transistors 18e and 18f transfer the signal that is based on the second electric charge from the FD 12 to the memories 19e and 19f (the time point t31 and the time point t35). In the imaging of the second time, the memory 19d stores a first pixel signal that is based on the first electric charge (the time point t28). In the imaging of the second time, the memories 19e and 19f store a second pixel signal that is based on the second electric charge (the time point t32 and the time point t36).

In the imaging of the first time, the high-sensitivity signal is obtained by adding the electric charge of the photoelectric conversion element 10a and the electric charge of the photoelectric conversion element 10d. In the imaging of the first time, the low-sensitivity signal is obtained on the basis of the electric charge of only the photoelectric conversion element 10b and the low-sensitivity signal is obtained on the basis of the electric charge of only the photoelectric conversion element 10c. The row positions of the two photoelectric conversion elements 10a and 10d are different from each other and the column positions of the two photoelectric conversion elements 10a and 10d are different from each other. The row positions of the two photoelectric conversion elements 10b and 10c are different from each other and the column positions of the two photoelectric conversion elements 10b and 10c are different from each other.

In the imaging of the second time, the high-sensitivity signal is obtained by adding the electric charge of the photoelectric conversion element 10b and the electric charge of the photoelectric conversion element 10c. In the imaging of the second time, the low-sensitivity signal is obtained on the basis of the electric charge of only the photoelectric conversion element 10a and the low-sensitivity signal is obtained on the basis of the electric charge of only the photoelectric conversion element 10d. Therefore, two types of high-sensitivity signals and four types of low-sensitivity signals are obtained through imaging twice.

A first combination and a second combination are different from each other. The first combination is a combination of photoelectric conversion elements that generate the high-sensitivity signal in the imaging of the first time. The second combination is a combination of photoelectric conversion elements that generate the high-sensitivity signal in the imaging of the second time. A third combination and a fourth combination are different from each other. The third combination is a combination of photoelectric conversion elements that generate the low-sensitivity signal in the imaging of the first time. The fourth combination is a combination of photoelectric conversion elements that generate the low-sensitivity signal in the imaging of the second time.

The solid-state imaging device 202 outputs the first image signal that is based on the high-sensitivity signal obtained through imaging twice and the second image signal that is based on the low-sensitivity signal obtained through imaging twice. The first image-processing unit 203a and the second image-processing unit 203b may average the first image signal output from the solid-state imaging device 202 through the imaging of the first time and the first image signal output from the solid-state imaging device 202 through the imaging of the second time. The first image-processing unit 203a and the second image-processing unit 203b may average the second image signal output from the solid-state imaging device 202 through the imaging of the first time and the second image signal output from the solid-state imaging device 202 through the imaging of the second time. In addition, the first image-processing unit 203a and the second image-processing unit 203b may average the two second image signals output from the solid-state imaging device 202 through the imaging of the first time. The first image-processing unit 203a and the second image-processing unit 203b may average the two second image signals output from the solid-state imaging device 202 through the imaging of the second time. The solid-state imaging device 202 may include a signal processing circuit that averages the two second image signals.

In each time of imaging twice, the two second image signals are output from the same pixel group 1c. The centroid position of the two first photoelectric conversion elements is the same as the centroid position of the pixel group 1c. The centroid position of the two second photoelectric conversion elements is the same as the centroid position of the pixel group 1c. For this reason, the centroid position of the two first photoelectric conversion elements in which the first electric charge is obtained is the same as the centroid position of the two second photoelectric conversion elements in which the second electric charge is obtained. In other words, the pixel centroid position of the first pixel signal (high-sensitivity signal) is the same as the pixel centroid position of the second pixel signal (low-sensitivity signal).

The first image-processing unit 203a and the second image-processing unit 203b combine the first image signal and the second image signal. The first image signal is generated on the basis of the first pixel signal and the second image signal is generated on the basis of the second pixel signal. Since the pixel centroid position of the first pixel signal is the same as the pixel centroid position of the second pixel signal, a high-quality combined image is obtained.

Fifth Embodiment

A fifth embodiment of the present invention will be described by using the solid-state imaging device 202 shown in FIG. 2. The solid-state imaging device 202 according to the fifth embodiment includes the pixel group 1b shown in FIG. 7.

In the following example, the solid-state imaging device 202 performs imaging twice. The first photoelectric conversion element in the imaging of the first time is the photoelectric conversion elements 10a, 10b, and 10c. The second photoelectric conversion element in the imaging of the first time is the photoelectric conversion element 10d.

In the imaging of the first time, the transfer transistors 11a, 11b, and 11c transfer a signal that is based on the first electric charge generated by the photoelectric conversion elements 10a, 10b, and 10c to the FD 12. In the imaging of the first time, the sample transistor 18a transfers the first electric charge held in the FD 12 to the memory 19a. In the imaging of the first time, the memory 19a stores the first pixel signal.

In the imaging of the first time, the transfer transistor 11d transfers a signal that is based on the second electric charge generated by the photoelectric conversion element 10d to the FD 12. In the imaging of the first time, the sample transistor 18b transfers the second electric charge held in the FD 12 to the memory 19b. In the imaging of the first time, the memory 19b stores the second pixel signal.

The first photoelectric conversion element in the imaging of the second time is the photoelectric conversion elements 10b, 10c, and 10d. The second photoelectric conversion element in the imaging of the second time is the photoelectric conversion element 10a.

In the imaging of the second time, the transfer transistors 11b, 11c, and 11d transfer the first electric charge generated by the photoelectric conversion elements 10b, 10c, and 10d to the FD 12. In the imaging of the second time, the sample transistor 18c transfers a signal that is based on the first electric charge held in the FD 12 to the memory 19c. In the imaging of the second time, the memory 19c stores the first pixel signal.

In the imaging of the second time, the transfer transistor 11a transfers the second electric charge generated by the photoelectric conversion element 10a to the FD 12. In the imaging of the second time, the sample transistor 18d transfers a signal that is based on the second electric charge held in the FD 12 to the memory 19d. In the imaging of the second time, the memory 19d stores the second pixel signal.

Figure 13:
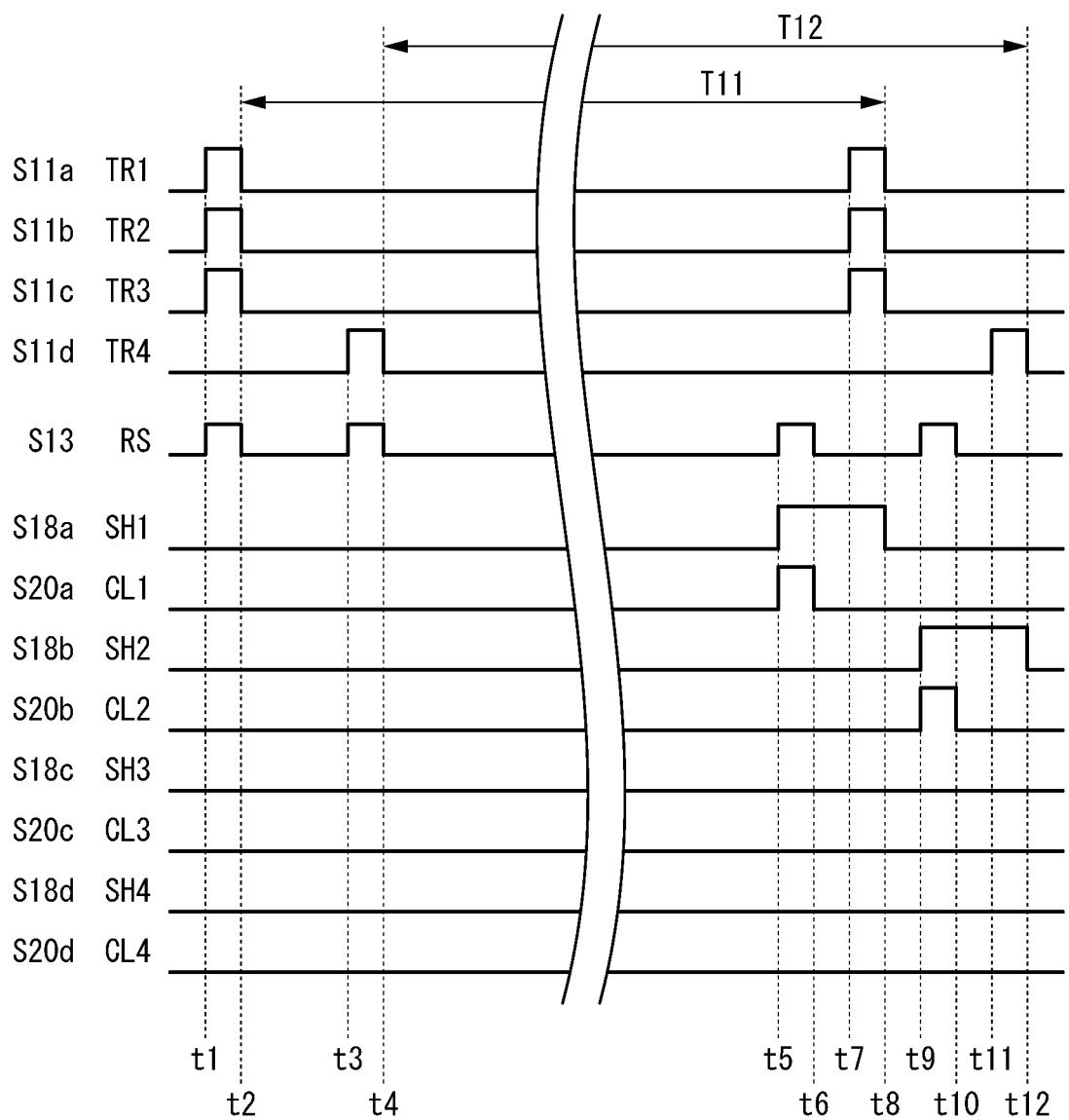
FIG. 13 is a timing chart showing an operation of a solid-state imaging device according to a fifth embodiment of the present invention.
Figure 14:
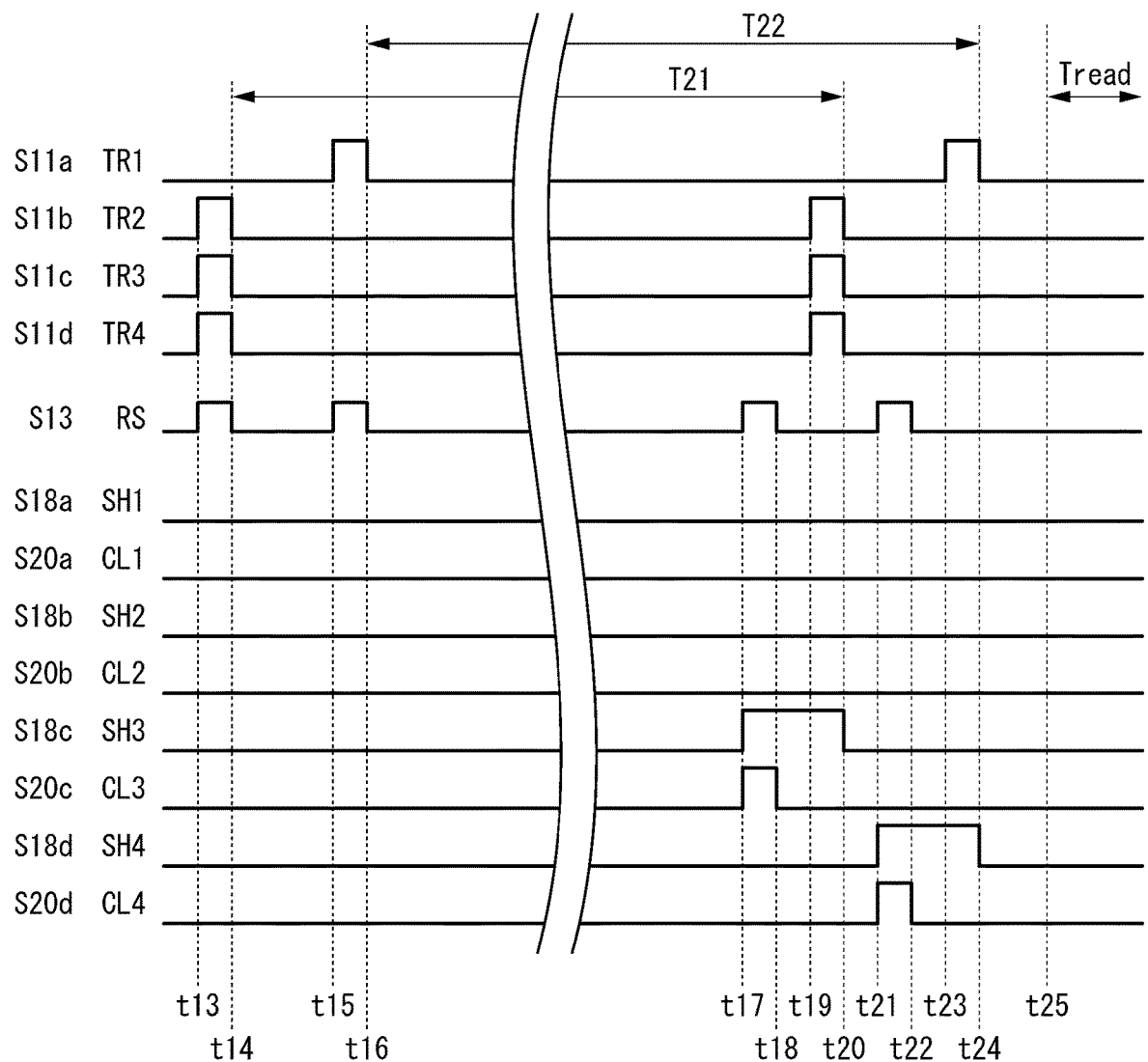
FIG. 14 is a timing chart showing an operation of the solid-state imaging device according to the fifth embodiment of the present invention.

FIG. 13 and FIG. 14 show an operation of the solid-state imaging device 202. FIG. 13 shows an operation of the solid-state imaging device 202 in the imaging of the first time. In the operation shown in FIG. 13, the photoelectric conversion elements 10a, 10b, and 10c generate the high-sensitivity signal and the signal is held in the memory 19a. In the operation shown in FIG. 13, the photoelectric conversion element 10d generates the low-sensitivity signal and the signal is held in the memory 19b.

FIG. 14 shows an operation of the solid-state imaging device 202 in the imaging of the second time. In the operation shown in FIG. 14, the photoelectric conversion elements 10b, 10c, and 10d generate the high-sensitivity signal and the signal is held in the memory 19c. In the operation shown in FIG. 14, the photoelectric conversion element 10a generates the low-sensitivity signal and the signal is held in the memory 19d.

At a time point t1, the transfer transistor 11a, the transfer transistor 11b, the transfer transistor 11c, and the first reset transistor 13 are turned on and the photoelectric conversion element 10a, the photoelectric conversion element 10b, and the photoelectric conversion element 10c are reset. At a time point t2 after the time point t1, the transfer transistor 11a, the transfer transistor 11b, the transfer transistor 11c, and the first reset transistor 13 are turned off. At the time point t2, the photoelectric conversion element 10a, the photoelectric conversion element 10b, and the photoelectric conversion element 10c start accumulation of electric charge, that is, generation of the pixel signal (high-sensitivity signal).

At a time point t3 after the time point t2, the transfer transistor 11d and the first reset transistor 13 are turned on and the photoelectric conversion element 10d is reset. At a time point t4 after the time point t3, the transfer transistor 11d and the first reset transistor 13 are turned off. At the time point t4, the photoelectric conversion element 10d starts accumulation of electric charge, that is, generation of the pixel signal (low-sensitivity signal).

At a time point t5 after the time point t4, the first reset transistor 13 is turned on and the FD 12 is reset. At a time point t6 after the time point t5, the first reset transistor 13 is turned off.

At the time point t5, the sample transistor 18a and the second reset transistor 20a are turned on and the clamp capacitor 17 and the memory 19a are reset. At the time point t6, the second reset transistor 20a is turned off.

At a time point t7 after the time point t6, the transfer transistor 11a, the transfer transistor 11b, and the transfer transistor 11c are turned on. At the time point t7, the electric charge output from each of the photoelectric conversion element 10a, the photoelectric conversion element 10b, and the photoelectric conversion element 10c is transferred to the FD 12.

At a time point t8 after the time point t7, the transfer transistor 11a, the transfer transistor 11b, and the transfer transistor 11c are turned off. At the time point t8, the photoelectric conversion element 10a, the photoelectric conversion element 10b, and the photoelectric conversion element 10c complete accumulation of electric charge, that is, generation of the pixel signal.

In an exposure period T11, electric charge that is based on light incident to each of the photoelectric conversion element 10a, the photoelectric conversion element 10b, and the photoelectric conversion element 10c is accumulated in each of the photoelectric conversion element 10a, the photoelectric conversion element 10b, and the photoelectric conversion element 10c. The exposure period T11 is a period from the time point t2 to the time point t8. The electric charge output from the photoelectric conversion element 10a, the electric charge output from the photoelectric conversion element 10b, and the electric charge output from the photoelectric conversion element 10c are added in the FD 12 and held in the FD 12.

At the time point t7, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18a samples the voltage of the second end of the clamp capacitor 17. At the time point t8, the memory 19a holds the pixel signal (high-sensitivity signal).

At a time point t9 after the time point t8, the first reset transistor 13 is turned on and the FD 12 is reset. At a time point t10 after the time point t9, the first reset transistor 13 is turned off.

At the time point t9, the sample transistor 18b and the second reset transistor 20b are turned on and the clamp capacitor 17 and the memory 19b are reset. At the time point t10, the second reset transistor 20b is turned off.

At a time point t11 after the time point t10, the transfer transistor 11d is turned on. At the time point t11, the electric charge output from the photoelectric conversion element 10d is transferred to the FD 12.

At a time point t12 after the time point t11, the transfer transistor 11d is turned off. At the time point t12, the photoelectric conversion element 10d completes accumulation of electric charge, that is, generation of the pixel signal.

In an exposure period T12, electric charge that is based on light incident to the photoelectric conversion element 10d is accumulated in the photoelectric conversion element 10d. The exposure period T12 is a period from the time point t4 to the time point t12. The electric charge output from the photoelectric conversion element 10d is held in the FD 12.

At the time point t11, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18b samples the voltage of the second end of the clamp capacitor 17. At the time point t12, the memory 19b holds the pixel signal (low-sensitivity signal).

At a time point t13 after the time point t12, the transfer transistor 11b, the transfer transistor 11c, the transfer transistor 11d, and the first reset transistor 13 are turned on and the photoelectric conversion element 10b, the photoelectric conversion element 10c, and the photoelectric conversion element 10d are reset. At a time point t14 after the time point t13, the transfer transistor 11b, the transfer transistor 11c, the transfer transistor 11d, and the first reset transistor 13 are turned off. At the time point t14, the photoelectric conversion element 10b, the photoelectric conversion element 10c, and the photoelectric conversion element 10d start accumulation of electric charge, that is, generation of the pixel signal (high-sensitivity signal).

At a time point t15 after the time point t14, the transfer transistor 11a and the first reset transistor 13 are turned on and the photoelectric conversion element 10a is reset. At a time point t16 after the time point t15, the transfer transistor 11a and the first reset transistor 13 are turned off. At the time point t16, the photoelectric conversion element 10a starts accumulation of electric charge, that is, generation of the pixel signal (low-sensitivity signal).

At a time point t17 after the time point t16, the first reset transistor 13 is turned on and the FD 12 is reset. At a time point t18 after the time point t17, the first reset transistor 13 is turned off.

At the time point t17, the sample transistor 18c and the second reset transistor 20c are turned on and the clamp capacitor 17 and the memory 19c are reset. At the time point t18, the second reset transistor 20c is turned off.

At a time point t19 after the time point t18, the transfer transistor 11b, the transfer transistor 11c, and the transfer transistor 11d are turned on. At the time point t19, the electric charge output from each of the photoelectric conversion element 10b, the photoelectric conversion element 10c, and the photoelectric conversion element 10d is transferred to the FD 12.

At a time point t20 after the time point t19, the transfer transistor 11b, the transfer transistor 11c, and the transfer transistor 11d are turned off. At the time point t20, the photoelectric conversion element 10b, the photoelectric conversion element 10c, and the photoelectric conversion element 10d complete accumulation of electric charge, that is, generation of the pixel signal.

In an exposure period T21, electric charge that is based on light incident to each of the photoelectric conversion element 10b, the photoelectric conversion element 10c, and the photoelectric conversion element 10d is accumulated in each of the photoelectric conversion element 10b, the photoelectric conversion element 10c, and the photoelectric conversion element 10d. The exposure period T21 is a period from the time point t14 to the time point t20. The electric charge output from the photoelectric conversion element 10b, the electric charge output from the photoelectric conversion element 10c, and the electric charge output from the photoelectric conversion element 10d are added in the FD 12 and held in the FD 12.

At the time point t19, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18c samples the voltage of the second end of the clamp capacitor 17. At the time point t20, the memory 19c holds the pixel signal (high-sensitivity signal).

At a time point t21 after the time point t20, the first reset transistor 13 is turned on and the FD 12 is reset. At a time point t22 after the time point t21, the first reset transistor 13 is turned off.

At the time point t21, the sample transistor 18d and the second reset transistor 20d are turned on and the clamp capacitor 17 and the memory 19d are reset. At the time point t22, the second reset transistor 20d is turned off.

At a time point t23 after the time point t22, the transfer transistor 11a is turned on. At the time point t23, the electric charge output from the photoelectric conversion element 10a is transferred to the FD 12.

At a time point t24 after the time point t23, the transfer transistor 11a is turned off. At the time point t24, the photoelectric conversion element 10a completes accumulation of electric charge, that is, generation of the pixel signal.

In an exposure period T22, electric charge that is based on light incident to the photoelectric conversion element 10a is accumulated in the photoelectric conversion element 10a. The exposure period T22 is a period from the time point t16 to the time point t24. The electric charge output from the photoelectric conversion element 10a is held in the FD 12.

At the time point t23, the first amplification transistor 14 amplifies the voltage that is based on the electric charge held in the FD 12 and outputs the amplified voltage as the pixel signal. The pixel signal output from the first amplification transistor 14 is held in the clamp capacitor 17. The sample transistor 18d samples the voltage of the second end of the clamp capacitor 17. At the time point t24, the memory 19d holds the pixel signal (low-sensitivity signal).

The operation shown in FIG. 13 and FIG. 14 is simultaneously performed in all the pixel groups 1b disposed in the solid-state imaging device 202. For this reason, the global-electronic-shutter operation is realized.

In a reading period Tread, the pixel signals held in the memory 19a, the memory 19b, the memory 19c, and the memory 19d are read. The reading period Tread is started at a time point t25 after the time point t24. The second amplification transistor 21a amplifies the voltage that is based on the pixel signal held in the memory 19a and outputs the amplified voltage as the first pixel signal. The selection transistor 22a outputs the first pixel signal output from the second amplification transistor 21a to the vertical signal line 9. The second amplification transistor 21b amplifies the voltage that is based on the pixel signal held in the memory 19b and outputs the amplified voltage as the second pixel signal. The selection transistor 22b outputs the second pixel signal output from the second amplification transistor 21b to the vertical signal line 9.

The second amplification transistor 21c amplifies the voltage that is based on the pixel signal held in the memory 19c and outputs the amplified voltage as the first pixel signal. The selection transistor 22c outputs the first pixel signal output from the second amplification transistor 21c to the vertical signal line 9. The second amplification transistor 21d amplifies the voltage that is based on the pixel signal held in the memory 19d and outputs the amplified voltage as the second pixel signal. The selection transistor 22d outputs the second pixel signal output from the second amplification transistor 21d to the vertical signal line 9.

In the operation shown in FIG. 13 and FIG. 14, the solid-state imaging device 202 performs imaging twice. In the imaging of the first time, the first photoelectric conversion elements 10a, 10b, and 10c generate first electric charge. In the imaging of the first time, the first photoelectric conversion element 10d generates second electric charge. In the imaging of the first time, the transfer transistors 11a, 11b, 11c, and 11d transfer the first electric charge and the second electric charge to the FD 12 (the time point t7 and the time point t11). In the imaging of the first time, the sample transistor 18a transfers the signal that is based on the first electric charge held in the FD 12 from the FD 12 to the memory 19a (the time point t7). In the imaging of the first time, the sample transistor 18b transfers the signal that is based on the second electric charge held in the FD 12 from the FD 12 to the memory 19b (the time point t11). In the imaging of the first time, the memory 19a stores a first pixel signal that is based on the first electric charge (the time point t8). In the imaging of the first time, the memory 19b stores a second pixel signal that is based on the second electric charge (the time point t12).

In the imaging of the second time, the first photoelectric conversion elements 10b, 10c, and 10d generate first electric charge. In the imaging of the second time, the first photoelectric conversion elements 10a generates second electric charge. In the imaging of the second time, the transfer transistors 11a, 11b, 11c, and 11d transfer the first electric charge and the second electric charge to the FD 12 (the time point t19 and the time point t23). In the imaging of the second time, the sample transistor 18c transfers the signal that is based on the first electric charge held in the FD 12 to the memory 19c (the time point t19). In the imaging of the second time, the sample transistor 18d transfers the signal that is based on the second electric charge held in the FD 12 to the memory 19d (the time point t23). In the imaging of the second time, the memory 19c stores a first pixel signal that is based on the first electric charge (the time point t20). In the imaging of the second time, the memory 19d stores a second pixel signal that is based on the second electric charge (the time point t24).

In the imaging of the first time, the high-sensitivity signal is obtained by adding the electric charge of the photoelectric conversion element 10a, the electric charge of the photoelectric conversion element 10b, and the electric charge of the photoelectric conversion element 10c. In the imaging of the first time, the low-sensitivity signal is obtained on the basis of the electric charge of only the photoelectric conversion element 10d. In the imaging of the second time, the high-sensitivity signal is obtained by adding the electric charge of the photoelectric conversion element 10b, the electric charge of the photoelectric conversion element 10c, and the electric charge of the photoelectric conversion element 10d. In the imaging of the second time, the low-sensitivity signal is obtained on the basis of the electric charge of only the photoelectric conversion element 10a. Therefore, two types of high-sensitivity signals and two types of low-sensitivity signals are obtained through imaging twice.

A first combination and a second combination are different from each other. The first combination is a combination of photoelectric conversion elements that generate the high-sensitivity signal in the imaging of the first time. The second combination is a combination of photoelectric conversion elements that generate the high-sensitivity signal in the imaging of the second time. A third combination and a fourth combination are different from each other. The third combination is a combination of photoelectric conversion elements that generate the low-sensitivity signal in the imaging of the first time. The fourth combination is a combination of photoelectric conversion elements that generate the low-sensitivity signal in the imaging of the second time.

The solid-state imaging device 202 outputs the first image signal that is based on the high-sensitivity signal obtained through imaging twice and the second image signal that is based on the low-sensitivity signal obtained through imaging twice. The first image-processing unit 203a and the second image-processing unit 203b may average the first image signal output from the solid-state imaging device 202 through the imaging of the first time and the first image signal output from the solid-state imaging device 202 through the imaging of the second time. The first image-processing unit 203a and the second image-processing unit 203b may average the second image signal output from the solid-state imaging device 202 through the imaging of the first time and the second image signal output from the solid-state imaging device 202 through the imaging of the second time.

The first image-processing unit 203a and the second image-processing unit 203b combine the first image signal and the second image signal. The first image signal is generated on the basis of the first pixel signal and the second image signal is generated on the basis of the second pixel signal. Since the pixel position of the first pixel signal is the same as the pixel position of the second pixel signal, a high-quality combined image is obtained.

In the operation shown in FIG. 11 and FIG. 12, two pieces of electric charge output from two photoelectric conversion elements are added. In the operation shown in FIG. 13 and FIG. 14, three pieces of electric charge output from three photoelectric conversion elements are added. For this reason, the signal ratio between the high-sensitivity signal and the low-sensitivity signal in the operation shown in FIG. 13 and FIG. 14 is larger than the signal ratio between the high-sensitivity signal and the low-sensitivity signal in the operation shown in FIG. 11 and FIG. 12.

Sixth Embodiment

Figure 15:
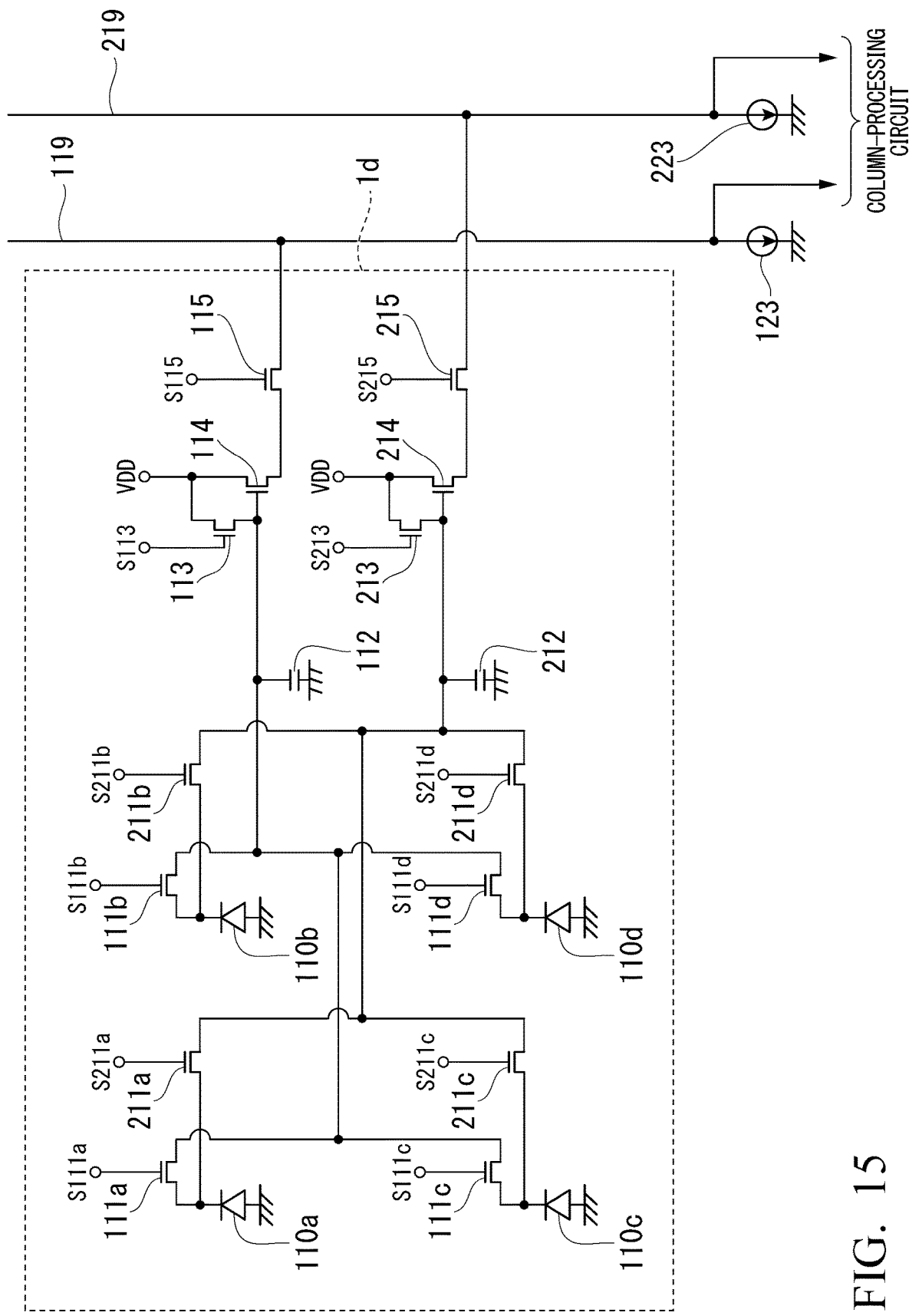
FIG. 15 is a circuit diagram showing a configuration of a pixel group according to a sixth embodiment of the present invention.

A sixth embodiment of the present invention will be described by using the solid-state imaging device 202 shown in FIG. 2. In the sixth embodiment, the pixel group 1a shown in FIG. 3 is changed to a pixel group 1d shown in FIG. 15. FIG. 15 shows a configuration of the pixel group 1d.

One pixel group 1d corresponds to the pixels 1 disposed in two rows and two columns. The pixel group 1d shown in FIG. 15 includes four photoelectric conversion elements 110a, 110b, 110c, and 110d, eight transfer transistors 111a, 111b, 111c, 111d, 211a, 211b, 211c, and 211d, FDs 112 and 212, reset transistors 113 and 213, amplification transistors 114 and 214, and selection transistors 115 and 215.

A schematic configuration of the pixel group 1d will be described. At least two pieces of first electric charge are generated by at least two first photoelectric conversion elements in a first exposure period. The at least two pieces of first electric charge are transferred to the FD 112 (first floating diffusion) at a first timing. The at least two pieces of first electric charge are added in the FD 112 and held in the FD 112. Second electric charge is generated by at least one second photoelectric conversion element in a second exposure period. The second exposure period is the same as the first exposure period. The second electric charge is transferred to the FD 212 (second floating diffusion) at a second timing and is held in the FD 212. The second timing is the same as the first timing. A first pixel signal that is based on the first electric charge held in the FD 112 is output to a vertical signal line 119 (first signal line). A second pixel signal that is based on the second electric charge held in the FD 212 is output to a vertical signal line 219 (second signal line) different from the vertical signal line 119.

A detailed configuration of the pixel group 1d will be described. The FD 112, the FD 212, the reset transistor 113, the reset transistor 213, the amplification transistor 114, the amplification transistor 214, the selection transistor 115, and the selection transistor 215 are shared in the pixel group 1d. The position at which each circuit element shown in FIG. 15 is disposed does not necessarily match the position at which the element is actually disposed.

The photoelectric conversion element 110a, the transfer transistor 111a, and the transfer transistor 211a correspond to a first pixel. The photoelectric conversion element 110b, the transfer transistor 111b, and the transfer transistor 211b correspond to a second pixel. The photoelectric conversion element 110c, the transfer transistor 111c, and the transfer transistor 211c correspond to a third pixel. The photoelectric conversion element 110d, the transfer transistor 111d, and the transfer transistor 211d correspond to a fourth pixel. Hereinafter, the configuration of the first pixel will be described among the four pixels 1 included in one pixel group 1d. The configurations of the second pixel, the third pixel, and the fourth pixel are similar to the configuration of the first pixel.

Hereinafter, the FD 112, the reset transistor 113, the amplification transistor 114, and the selection transistor 115 will be described. The FD 212, the reset transistor 213, the amplification transistor 214, and the selection transistor 215 are similar to the FD 112, the reset transistor 113, the amplification transistor 114, and the selection transistor 115, respectively. The FD 112, the reset transistor 113, the amplification transistor 114, and the selection transistor 115 are circuits for outputting a high-sensitivity signal. The FD 212, the reset transistor 213, the amplification transistor 214, and the selection transistor 215 are circuits for outputting a low-sensitivity signal.

A first end of the photoelectric conversion element 110a is connected to a ground. A drain of the transfer transistor 111a is connected to a second end of the photoelectric conversion element 110a. A gate of the transfer transistor 111a is connected to the vertical scanning circuit 3. A transfer pulse S111a is supplied from the vertical scanning circuit 3 to the gate of the transfer transistor 111a.

A first end of the FD 112 is connected to a source of the transfer transistor 111a, a source of the transfer transistor 111b, a source of the transfer transistor 111c, and a source of the transfer transistor 111d. A second end of the FD 112 is connected to the ground. A drain of the reset transistor 113 is connected to a power source that supplies power source voltage VDD. A source of the reset transistor 113 is connected to the source of the transfer transistor 111a, the source of the transfer transistor 111b, the source of the transfer transistor 111c, the source of the transfer transistor 111d, and the first end of the FD 112. A gate of the reset transistor 113 is connected to the vertical scanning circuit 3. A reset pulse S113 is supplied from the vertical scanning circuit 3 to the gate of the reset transistor 113.

A drain of the amplification transistor 114 is connected to the power source that supplies the power supply voltage VDD. A gate of the amplification transistor 114 is connected to the source of the transfer transistor 111a, the source of the transfer transistor 111b, the source of the transfer transistor 111c, the source of the transfer transistor 111d, and the first end of the FD 112. A drain of the selection transistor 115 is connected to a source of the amplification transistor 114. A source of the selection transistor 115 is connected to the vertical signal line 119. A gate of the selection transistor 115 is connected to the vertical scanning circuit 3. A selection pulse S115 is supplied from the vertical scanning circuit 3 to the gate of the selection transistor 115.

The photoelectric conversion element 110a is similar to the photoelectric conversion element 10a shown in FIG. 3. The transfer transistor 111a is similar to the transfer transistor 11a shown in FIG. 3. When the transfer transistor 111a is in the ON state, the photoelectric conversion element 110a and the FD 112 are electrically connected to each other. When the photoelectric conversion element 110a and the FD 112 are electrically connected to each other, the transfer transistor 111a transfers the electric charge accumulated in the photoelectric conversion element 110a to the FD 112. Turning on and off the transfer transistor 111a is controlled on the basis of the transfer pulse S111a supplied from the vertical scanning circuit 3.

A transfer pulse S111b is supplied from the vertical scanning circuit 3 to a gate of the transfer transistor 111b. A transfer pulse S111c is supplied from the vertical scanning circuit 3 to a gate of the transfer transistor 111c. A transfer pulse S111d is supplied from the vertical scanning circuit 3 to a gate of the transfer transistor 111d. A transfer pulse S211a is supplied from the vertical scanning circuit 3 to a gate of the transfer transistor 211a. A transfer pulse S211b is supplied from the vertical scanning circuit 3 to a gate of the transfer transistor 211b. A transfer pulse S211c is supplied from the vertical scanning circuit 3 to a gate of the transfer transistor 211c. A transfer pulse S211d is supplied from the vertical scanning circuit 3 to a gate of the transfer transistor 211d.

The FD 112 temporarily holds and accumulates the electric charge transferred from the photoelectric conversion elements 110a, 110b, 110c, and 110d and converts the electric charge into voltage.

The reset transistor 113 is similar to the first reset transistor 13 shown in FIG. 3. When the reset transistor 113 is in the ON state, the power source and the FD 112 are electrically connected to each other. When the power source and the FD 112 are electrically connected to each other, the reset transistor 113 resets the FD 112. Turning on and off the reset transistor 113 is controlled on the basis of the reset pulse S113 supplied from the vertical scanning circuit 3. When the transfer transistor 111a and the reset transistor 113 are in the ON state, the photoelectric conversion element 110a is reset. By resetting the photoelectric conversion element 110a and the FD 112, the amount of electric charge accumulated in the photoelectric conversion element 110a and the FD 112 is controlled. Through this reset, the state (potential) of the photoelectric conversion element 110a and the FD 112 is set to a reference state (reference potential or reset level).

The amplification transistor 114 amplifies the voltage that is based on the electric charge held in the FD 112 and outputs the amplified voltage as the pixel signal from the source. A current source 123 connected to the vertical signal line 119 functions as a load of the amplification transistor 114 and supplies current for driving the amplification transistor 114 to the amplification transistor 114. The amplification transistor 114 and the current source 123 constitute a source follower circuit.

A current source 223 is connected to the vertical signal line 219. The amplification transistor 214 and the current source 223 constitute a source follower circuit.

The selection transistor 115 is connected to the amplification transistor 114 and the vertical signal line 119. The selection transistor 115 is similar to the selection transistor 22a shown in FIG. 3. When the selection transistor 115 is in the ON state, the amplification transistor 114 and the vertical signal line 119 are electrically connected to each other. When the amplification transistor 114 and the vertical signal line 119 are electrically connected to each other, the selection transistor 115 outputs the pixel signal output from the amplification transistor 114 to the vertical signal line 119. Turning on and off the selection transistor 115 is controlled on the basis of the selection pulse S115 supplied from the vertical scanning circuit 3.

A reset pulse S213 is supplied from the vertical scanning circuit 3 to the gate of the reset transistor 213. A selection pulse S215 is supplied from the vertical scanning circuit 3 to the gate of the selection transistor 215.

Figure 16:
FIG. 16 is a timing chart showing an operation of the solid-state imaging device according to the sixth embodiment of the present invention.

FIG. 16 shows an operation of the solid-state imaging device 202. In FIG. 16, a waveform of each pulse is shown. The horizontal direction in FIG. 16 represents time and the vertical direction in FIG. 16 represents voltage. In the operation shown in FIG. 16, the photoelectric conversion elements 110a and 110d generate a high-sensitivity signal and the signal is held in the FD 112. In the operation shown in FIG. 16, the photoelectric conversion element 110b generates a low-sensitivity signal and the signal is held in the FD 212. In the operation shown in FIG. 16, the high-sensitivity signal and the low-sensitivity signal are read in parallel with each other through a rolling-shutter operation.

In FIG. 16, a waveform of a horizontal synchronizing signal HD is shown. One horizontal period includes a horizontal blanking period and a horizontal effective period. In the horizontal blanking period, the level of the horizontal synchronizing signal HD is an L level. In the horizontal effective period, the level of the horizontal synchronizing signal HD is an H level. In the horizontal blanking period, the solid-state imaging device 202 selects a predetermined row in the array of the pixel group 1d. In the pixel group 1d in the selected row, a reset operation, an accumulation operation, and signal reading are performed. In the horizontal blanking period, the column-processing circuit 4 performs noise elimination, amplification, and the like. The signal processed by the column-processing circuit 4 is output to the outside of the solid-state imaging device 202 in the horizontal effective period.

Each pulse shown in FIG. 16 is supplied to two rows in the array of the pixel group 1d. Hereinafter, an operation of the pixel group 1d of the n-th row will be described.

Before a time point t1, the level of each pulse is an L level. At the time point t1, the transfer pulse S111a, the transfer pulse S111b, the transfer pulse S111c, the transfer pulse S111d, the transfer pulse S211a, the transfer pulse S211b, the transfer pulse S211c, the transfer pulse S211d, the reset pulse S113 and the reset pulse S213 change from the L level to an H level. For this reason, the transfer transistor 111a, the transfer transistor 111b, the transfer transistor 111c, the transfer transistor 111d, the transfer transistor 211a, the transfer transistor 211b, the transfer transistor 211c, the transfer transistor 211d, the reset transistor 113, and the reset transistor 213 are turned on. At the time point t1, the photoelectric conversion element 110a, the photoelectric conversion element 110b, the photoelectric conversion element 110c, and the photoelectric conversion element 110d are reset.

At a time point t2 after the time point t1, the transfer pulse S111a, the transfer pulse S111b, the transfer pulse S111c, the transfer pulse S111d, the transfer pulse S211a, the transfer pulse S211b, the transfer pulse S211c, the transfer pulse S211d, the reset pulse S113 and the reset pulse S213 change from the H level to the L level. For this reason, the transfer transistor 111a, the transfer transistor 111b, the transfer transistor 111c, the transfer transistor 111d, the transfer transistor 211a, the transfer transistor 211b, the transfer transistor 211c, the transfer transistor 211d, the reset transistor 113, and the reset transistor 213 are turned off. At the time point t2, the photoelectric conversion element 110a, the photoelectric conversion element 110b, the photoelectric conversion element 110c, and the photoelectric conversion element 110d start imaging. In other words, the photoelectric conversion element 110a, the photoelectric conversion element 110b, the photoelectric conversion element 110c, and the photoelectric conversion element 110d start accumulation of electric charge, that is, generation of the pixel signal.

The electric charge generated by the photoelectric conversion element 110c is not used for signal processing. The electric charge overflowing the photoelectric conversion element 110c influences other circuits. The photoelectric conversion element 110c is also reset in order to suppress the influence.

In the operation shown in FIG. 16, each photoelectric conversion element is reset by a transfer transistor (111a to 111d) for the high-sensitivity signal, a reset transistor (113) for the high-sensitivity signal, a transfer transistor (211a to 211d) for the low-sensitivity signal, a reset transistor (213) for the low-sensitivity signal. Each photoelectric conversion element may be reset by only the transfer transistor (111a to 111d) for the high-sensitivity signal and the reset transistor (113) for the high-sensitivity signal. Each photoelectric conversion element may be reset by only the transfer transistor (211a to 211d) for the low-sensitivity signal and the reset transistor (213) for the low-sensitivity signal.

At a time point t3 after the time point t2, the selection pulse S115 changes from the L level to the H level. For this reason, the selection transistor 115 is turned on. At the time point t3, the selection pulse S215 changes from the L level to the H level. For this reason, the selection transistor 215 is turned on.

At a time point t4 after the time point t3, the reset pulse S113 changes from the L level to the H level. For this reason, the reset transistor 113 is turned on. At the time point t4, the FD 112 is reset. The amplification transistor 114 amplifies the voltage of the reset FD 112 and outputs the amplified voltage as a reset signal. The selection transistors 115 outputs the reset signal output from the amplification transistor 114 to the vertical signal line 119.

At the time point t4, the reset pulse S213 changes from the L level to the H level. For this reason, the reset transistor 213 is turned on. At the time point t4, the FD 212 is reset. The amplification transistor 214 amplifies the voltage of the reset FD 212 and outputs the amplified voltage as a reset signal. The selection transistors 215 outputs the reset signal output from the amplification transistor 214 to the vertical signal line 219.

At a time point t5 after the time point t4, the reset pulse S113 changes from the H level to the L level. For this reason, the reset transistor 113 is turned off. At the time point t5, the reset pulse S213 changes from the H level to the L level. For this reason, the reset transistor 213 is turned off.

At a time point t6 after the time point t5, the transfer pulse S111a and the transfer pulse S111d change from the L level to the H level. For this reason, the transfer transistor 111a and the transfer transistor 111d are turned on. At the time point t6, the electric charge output from each of the photoelectric conversion element 110a and the photoelectric conversion element 110d is transferred to the FD 112.

At the time point t6, the transfer pulse S211b changes from the L level to the H level. For this reason, the transfer transistor 211b is turned on. At the time point t6, the electric charge output from the photoelectric conversion element 110b is transferred to the FD 212.

At a time point t7 after the time point t6, the transfer pulse S111a and the transfer pulse S111d change from the H level to the L level. For this reason, the transfer transistor 111a and the transfer transistor 111d are turned off. At the time point t7, the photoelectric conversion element 110a and the photoelectric conversion element 110d complete imaging. In other words, the photoelectric conversion element 110a and the photoelectric conversion element 110d complete accumulation of electric charge, that is, generation of the pixel signal. The electric charge output from the photoelectric conversion element 110a and the electric charge output from the photoelectric conversion element 110d are added in the FD 112. The added electric charge is held in the FD 112 as the high-sensitivity signal.

The amplification transistor 114 amplifies the voltage that is based on the electric charge held in the FD 112 and outputs the amplified voltage as a first pixel signal. The selection transistors 115 outputs the first pixel signal output from the amplification transistor 114 to the vertical signal line 119. The column-processing circuit 4 generates a signal that represents the difference between the first pixel signal and the reset signal.

At the time point t7, the transfer pulse S211b changes from the H level to the L level. For this reason, the transfer transistor 211b is turned off. At the time point t7, the photoelectric conversion element 110b completes imaging. In other words, the photoelectric conversion element 110b completes accumulation of electric charge, that is, generation of the pixel signal. The electric charge output from the photoelectric conversion element 110b is held in the FD 212 as the low-sensitivity signal.

The amplification transistor 214 amplifies the voltage that is based on the electric charge held in the FD 212 and outputs the amplified voltage as a second pixel signal. The selection transistors 215 outputs the second pixel signal output from the amplification transistor 214 to the vertical signal line 219. The column-processing circuit 4 generates a signal that represents the difference between the second pixel signal and the reset signal.

At a time point t8 after the time point t7, the selection pulse S115 changes from the H level to the L level. For this reason, the selection transistor 115 is turned off. At the time point t8, the selection pulse S215 changes from the H level to the L level. For this reason, the selection transistor 215 is turned off.

The photoelectric conversion element 110a, the photoelectric conversion element 110b, and the photoelectric conversion element 110d simultaneously start imaging and simultaneously complete the imaging. An exposure period for the high-sensitivity signal is the same as an exposure period for the low-sensitivity signal.

In the horizontal effective period starting at a time point t9 after the time point t8, the solid-state imaging device 202 outputs a first image signal that is based on the first pixel signal of the n-th row and a second image signal that is based on the second pixel signal of the n-th row to the outside of the solid-state imaging device 202.

The solid-state imaging device 202 performs the above-described operation for each row in the array of the pixel group 1d. Timings of operations of rows are shifted from each other by one horizontal period. For this reason, the rolling-shutter operation is realized.

At the time point t7, two pieces of first electric charge generated by two first photoelectric conversion elements are transferred to the FD 112. The first photoelectric conversion elements are the photoelectric conversion element 110a and the photoelectric conversion element 110d. The two pieces of first electric charge are added in the FD 112 and held in the FD 112. At the time point t7, the second electric charge generated by a second photoelectric conversion element is transferred to the FD 212 and is held in the FD 212. The second photoelectric conversion element is the photoelectric conversion element 110b. The first pixel signal that is based on the first electric charge held in the FD 112 is output to the vertical signal line 119 at the time point t7. The second pixel signal that is based on the second electric charge held in the FD 212 is output to the vertical signal line 219 at the time point t7.

Three or more first photoelectric conversion elements may generate three or more pieces of first electric charge. Two or more second photoelectric conversion elements may generate two or more pieces of second electric charge.

In the operation shown in FIG. 16, the photoelectric conversion elements 110a and 110d are used for acquiring the high-sensitivity signal and the photoelectric conversion element 110b is used for acquiring the low-sensitivity signal. The row positions of the two photoelectric conversion elements 110a and 110d are different from each other and the column positions of the two photoelectric conversion elements 110a and 110d are different from each other. As long as the FD 112 and the FD 212 are shared by each photoelectric conversion element, it is possible to acquire each of the high-sensitivity signal and the low-sensitivity signal by using a combination of arbitrary photoelectric conversion element. For this reason, the direction in which a plurality of pixels related to addition of electric charge are disposed is not limited to the horizontal direction or the vertical direction.

The high-sensitivity signal is acquired by adding the electric charge of the photoelectric conversion element 110a and the electric charge of the photoelectric conversion element 110d. The low-sensitivity signal is acquired on the basis of the electric charge of only the photoelectric conversion element 110b. In addition, the exposure period for generating the high-sensitivity signal is the same as the exposure period for generating the low-sensitivity signal.

Therefore, by combining the first image signal and the second image signal, it is possible to obtain a high-dynamic-range image in which deterioration of the image quality is suppressed. The first image signal is generated on the basis of the high-sensitivity signal. The second image signal is generated on the basis of the low-sensitivity signal. The solid-state imaging device 202 and the imaging system 200 can suppress deterioration of the image quality.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for a solid-state imaging device, including:
   a plurality of photoelectric conversion elements disposed in a matrix shape; and
   a plurality of pixel groups,
   wherein each photoelectric conversion element included in the plurality of photoelectric conversion elements belongs to any one pixel group included in the plurality of pixel groups,
   each pixel group included in the plurality of pixel groups includes at least three photoelectric conversion elements included in the plurality of photoelectric conversion elements,
   the at least three photoelectric conversion elements include at least two first photoelectric conversion elements configured to generate first electric charge and at least one second photoelectric conversion element configured to generate second electric charge,
   the at least three photoelectric conversion elements are disposed in at least two rows and at least two columns,
   each pixel group included in the plurality of pixel groups includes:
   a floating diffusion;
   a first memory; and
   a second memory,
   said method comprising the steps of:
   generating the first electric charge by the first photoelectric conversion elements in a first exposure period,
   transferring the first electric charge to the floating diffusion at a first timing,
   generating at least two pieces of the first electric charge by the at least two first photoelectric conversion elements that are added in the floating diffusion and held in the floating diffusion,
   storing in the first memory a first pixel signal that is based on the first electric charge held in the floating diffusion,
   generating the second electric charge by the second photoelectric conversion element in a second exposure period, at least part of the second exposure period overlapping at least part of the first exposure period,
   transferring the second electric charge to the floating diffusion at a second timing different from the first timing and is held in the floating diffusion, and
   storing in the second memory a second pixel signal that is based on the second electric charge held in the floating diffusion.

2. The method for a solid-state imaging device according to claim 1, further comprising:
   a first substrate including the plurality of photoelectric conversion elements; and
   a second substrate that is stacked on the first substrate and includes the first memory and the second memory.

3. The method for a solid-state imaging device according to claim 1,
   wherein each pixel group included in the plurality of pixel groups further includes:
   a transfer transistor configured to transfer the first electric charge and the second electric charge to the floating diffusion;
   a first switch connected to the floating diffusion and the first memory; and
   a second switch connected to the floating diffusion and the second memory, the method further comprising the steps of:
   transferring, when the first switch is in an ON state and the second switch is in an OFF state, the first electric charge held in the floating diffusion to the first memory using the first switch, and
   transferring, when the second switch is in an ON state and the first switch is in an OFF state, the second electric charge held in the floating diffusion to the second memory using the second switch.

4. The method for a solid-state imaging device according to claim 3,
   wherein each pixel group included in the plurality of pixel groups includes at least four photoelectric conversion elements included in the plurality of photoelectric conversion elements, and
   the at least four photoelectric conversion elements are disposed in at least two consecutive rows and at least two consecutive columns.

5. The method for a solid-state imaging device according to claim 4, further comprising the steps of:
   generating the second electric charge using the at least four photoelectric conversion elements, which include the at least two first photoelectric conversion elements and at least two second photoelectric conversion elements,
   sequentially transferring, using the transfer transistor, at least two pieces of the second electric charge generated by the at least two second photoelectric conversion elements to the floating diffusion,
   transferring, using the second switch, the second electric charge held in the floating diffusion to the second memory each time the second electric charge is transferred to the floating diffusion, and
   separately storing in the second memory at least two second pixel signals that are based on the at least two pieces of the second electric charge.

6. The method for a solid-state imaging device according to claim 5, further comprising the steps of:
   performing, using the solid-state imaging device, multiple times of imaging,
   generating, in each of the multiple times of imaging, the first electric charge and the second electric charge using the first and second photoelectric conversion elements, respectively,
   transferring, in each of the multiple times of imaging, the first electric charge and the second electric charge to the floating diffusion using the transfer transistor,
   transferring, in each of the multiple times of imaging, the first electric charge held in the floating diffusion to the first memory and the second electric charge held in the floating diffusion to the second memory using the first and second switch, respectively, and storing, in each of the multiple times of imaging, the first pixel signal and the second pixel signal in the first and second memory, respectively, wherein in each pixel group included in the plurality of pixel groups, a combination of the at least two first photoelectric conversion elements is different between the multiple times of imaging and a combination of the at least two second photoelectric conversion elements is different between the multiple times of imaging.

7. The method for a solid-state imaging device according to claim 1, wherein each pixel group included in the plurality of pixel groups includes at least four photoelectric conversion elements included in the plurality of photoelectric conversion elements, and the at least four photoelectric conversion elements are disposed in at least two consecutive rows and at least two consecutive columns.

8. An imaging system, comprising:

the method for a solid-state imaging device according to claim 1; and a signal processing circuit configured to combine a first image signal that is based on the first pixel signal and a second image signal that is based on the second pixel signal.

9. A method for a solid-state imaging device, including:

a plurality of photoelectric conversion elements disposed in a matrix shape; and a plurality of pixel groups, wherein each photoelectric conversion element included in the plurality of photoelectric conversion elements belongs to any one pixel group included in the plurality of pixel groups, each pixel group included in the plurality of pixel groups includes at least three photoelectric conversion elements included in the plurality of photoelectric conversion elements, the at least three photoelectric conversion elements include at least two first photoelectric conversion elements configured to generate first electric charge and at least one second photoelectric conversion element configured to generate second electric charge, the at least three photoelectric conversion elements are disposed in at least two rows and at least two columns, each pixel group included in the plurality of pixel groups includes:

a first floating diffusion; and a second floating diffusion, said method comprising the steps of:

generating the first electric charge by the first photoelectric conversion elements in an exposure period, transferring the first electric charge to the first floating diffusion at a first timing, generating at least two pieces of the first electric charge by the at least two first photoelectric conversion elements are added in the first floating diffusion and held in the first floating diffusion, generating the second electric charge by the second photoelectric conversion element in the exposure period, transferring the second electric charge to the second floating diffusion at a second timing the same as the first timing and is held in the second floating diffusion, outputting a first pixel signal that is based on the first electric charge held in the first floating diffusion to a first signal line, and outputting a second pixel signal that is based on the second electric charge held in the second floating diffusion to a second signal line different from the first signal line.

10. An imaging system, comprising: the method for a solid-state imaging device according to claim 9; and a signal processing circuit configured to combine a first image signal that is based on the first pixel signal and a second image signal that is based on the second pixel signal.

* * * * *